United States Patent
Nishikawa et al.

(10) Patent No.: US 10,991,705 B2
(45) Date of Patent: Apr. 27, 2021

(54) THREE-DIMENSIONAL MEMORY DEVICE HAVING ENHANCED CONTACT BETWEEN POLYCRYSTALLINE CHANNEL AND EPITAXIAL PEDESTAL STRUCTURE AND METHOD OF MAKING THE SAME

(71) Applicant: SANDISK TECHNOLOGIES LLC, Addison, TX (US)

(72) Inventors: Masatoshi Nishikawa, Nagoya (JP); Jayavel Pachamuthu, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/556,854

(22) Filed: Aug. 30, 2019

(65) Prior Publication Data

US 2021/0035998 A1 Feb. 4, 2021

Related U.S. Application Data

(63) Continuation-in-part of application No. 16/526,128, filed on Jul. 30, 2019.

(51) Int. Cl.
*H01L 27/11556* (2017.01)
*H01L 27/11519* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC .................. H01L 27/11556; H01L 21/324
See application file for complete search history.

(56) References Cited

U.S. PATENT DOCUMENTS 5,915,167 A 6/1999 Leedy
6,005,285 A * 12/1999 Gardner ............ H01L 21/02381
257/607

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Shih Tsun A Chou
(74) *Attorney, Agent, or Firm* — The Marbury Law Group PLLC

(57) ABSTRACT

An alternating stack of insulating layers and sacrificial material layers is formed over a substrate. A memory opening is formed through the alternating stack. An amorphous semiconductor material portion is formed at a bottom region of the memory opening. A memory film is formed in the memory opening. The memory film includes an opening at a bottom portion thereof, and a surface of the amorphous semiconductor material portion is physically exposed at a bottom of the opening in the memory film. An amorphous semiconductor channel material layer is formed on the exposed surface of the amorphous semiconductor material portion and over the memory film. A vertical semiconductor channel is formed by annealing the amorphous semiconductor material portion and the amorphous semiconductor channel material layer. The vertical semiconductor channel and contacts an entire top surface of an underlying semiconductor material portion.

18 Claims, 31 Drawing Sheets

(51) Int. Cl.
  *H01L 27/11582* (2017.01)
  *H01L 27/1157* (2017.01)
  *H01L 27/11565* (2017.01)
  *H01L 27/11524* (2017.01)

(52) U.S. Cl.
  CPC .. *H01L 27/11524* (2013.01); *H01L 27/11565* (2013.01); *H01L 27/11582* (2013.01)

(56) References Cited

U.S. PATENT DOCUMENTS

| | | | |
|---|---|---|---|
| 9,230,980 | B2 | 1/2016 | Rabkin et al. |
| 9,524,977 | B2 | 12/2016 | Sharangpani et al. |
| 9,530,785 | B1 | 12/2016 | Koka et al. |
| 9,576,967 | B1 | 2/2017 | Kimura et al. |
| 9,627,395 | B2 | 4/2017 | Zhang et al. |
| 9,754,958 | B2 | 9/2017 | Pachamuthu et al. |
| 9,799,669 | B2 | 10/2017 | Rabkin et al. |
| 9,842,851 | B2 | 12/2017 | Pachamuthu et al. |
| 9,870,945 | B2 | 1/2018 | Pachamuthu et al. |
| 10,121,794 | B2 | 11/2018 | Gunji-Yoneoka et al. |
| 2015/0076586 | A1* | 3/2015 | Rabkin ............ H01L 27/11578 257/324 |
| 2016/0056169 | A1 | 2/2016 | Lee et al. |
| 2016/0111432 | A1 | 4/2016 | Rabkin et al. |
| 2016/0126253 | A1 | 5/2016 | Lee et al. |
| 2016/0268209 | A1 | 9/2016 | Pachamuthu et al. |
| 2016/0307908 | A1 | 10/2016 | Sharangpani et al. |
| 2017/0103997 | A1* | 4/2017 | Lee .................... H01L 29/04 |
| 2017/0125437 | A1 | 5/2017 | Pachamuthu et al. |
| 2017/0125438 | A1 | 5/2017 | Pachamuthu et al. |
| 2017/0365613 | A1* | 12/2017 | Gunji-Yoneoka .......... H01L 27/11524 |
| 2019/0019809 | A1 | 1/2019 | Lee et al. |
| 2019/0348434 | A1 | 11/2019 | Shioda et al. |

OTHER PUBLICATIONS

U.S. Appl. No. 16/200,115, filed Nov. 26, 2018, SanDisk Technologies LLC.
U.S. Appl. No. 16/224,367, filed Dec. 18, 2018, SanDisk Technologies LLC.
U.S. Appl. No. 16/290,277, filed Mar. 1, 2019, SanDisk Technologies LLC.
U.S. Appl. No. 16/291,673, filed Mar. 4, 2019, SanDisk Technologies LLC.
U.S. Appl. No. 16/295,206, filed Mar. 7, 2019, SanDisk Technologies LLC.
U.S. Appl. No. 16/407,310, filed May 9, 2019, SanDisk Technologies LLC.
U.S. Appl. No. 16/526,128, filed Jul. 30, 2019, SanDisk Technologies LLC.
Nishikawa, M. et al., "Three-Dimensional Memory Device Having Enhanced Contact Between Polycrystalline Channel and Epitaxial Pedestal Structure and Method of Making the Same," U.S. Appl. No. 16/556,919, filed Aug. 30, 2019.
USPTO Office Communication, Non-Final Office Action, for U.S. Appl. No. 16/526,128, dated Jun. 12, 2020, 19 pages.
Sze, S. M. et al., "Physics of Semiconductor Devices," by John Wiley & Sons, Inc., pp. 16-32, (2007).
USPTO Office Communication, Non-Final Office Action, for U.S. Appl. No. 16/556,919, dated May 29, 2020, 16 pages.
USPTO Office Communication, Notice of Allowance and Fee(s), for U.S. Appl. No. 16/583,906, dated Jun. 4, 2020, 12 pages.

* cited by examiner

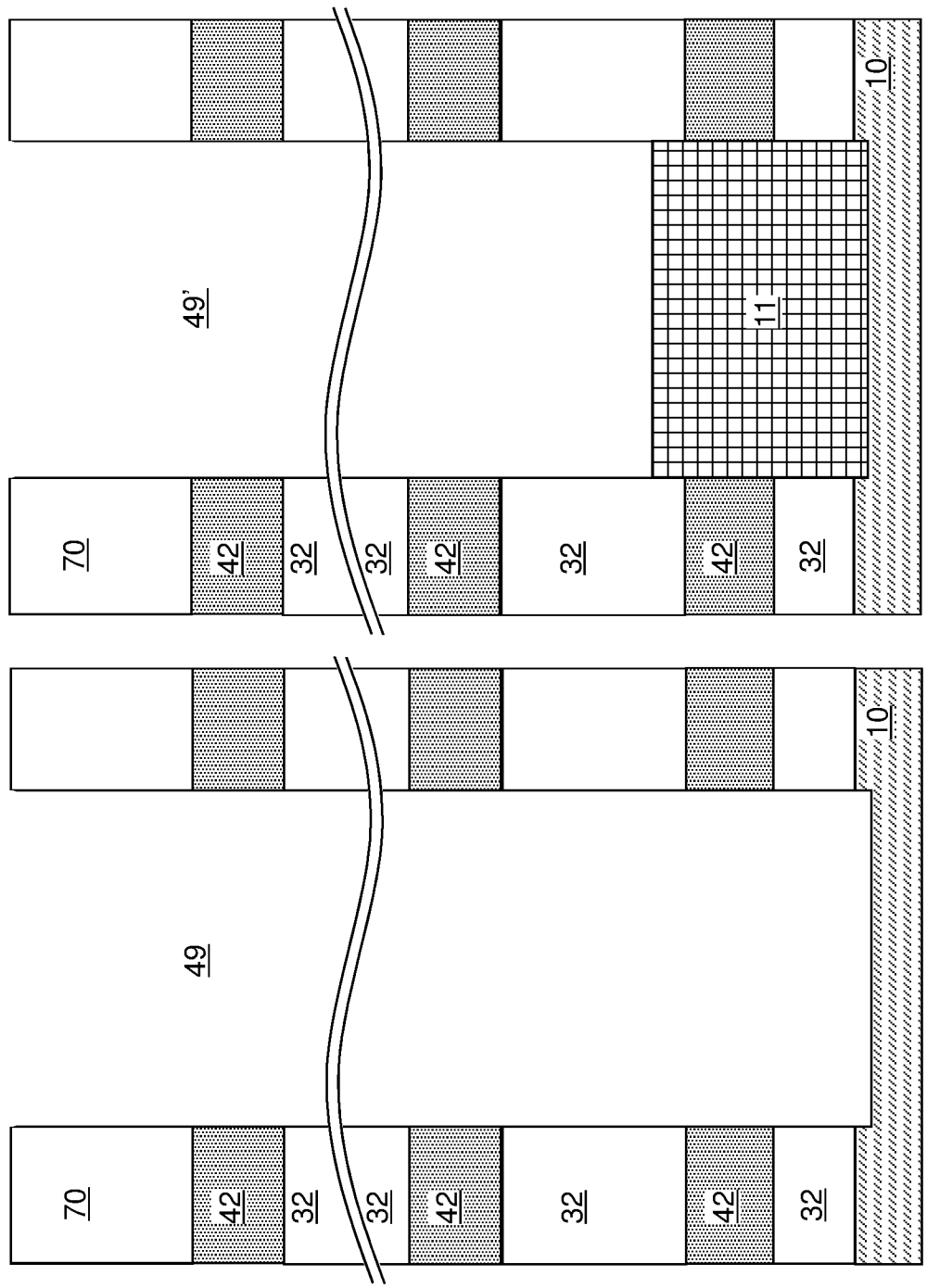

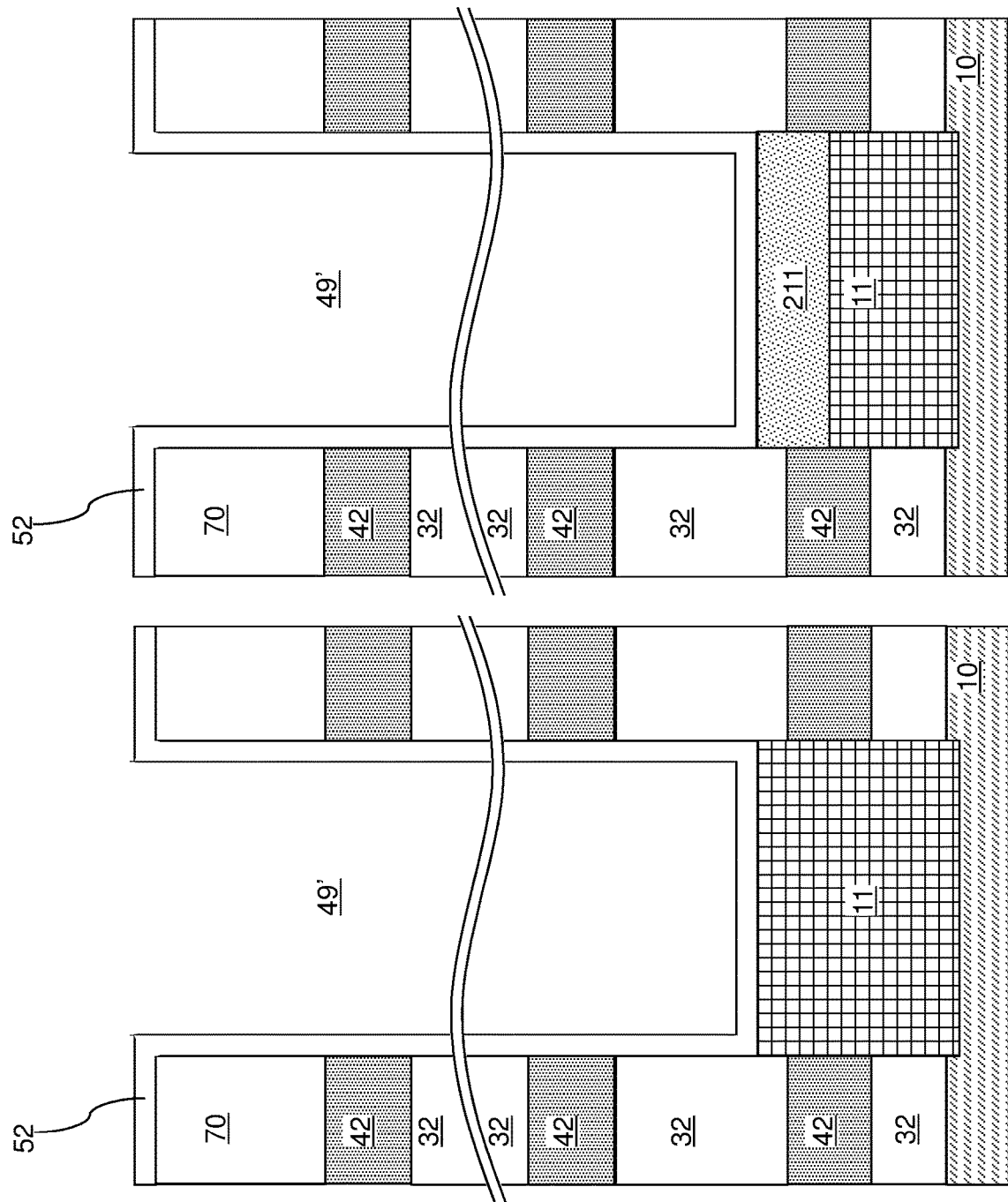

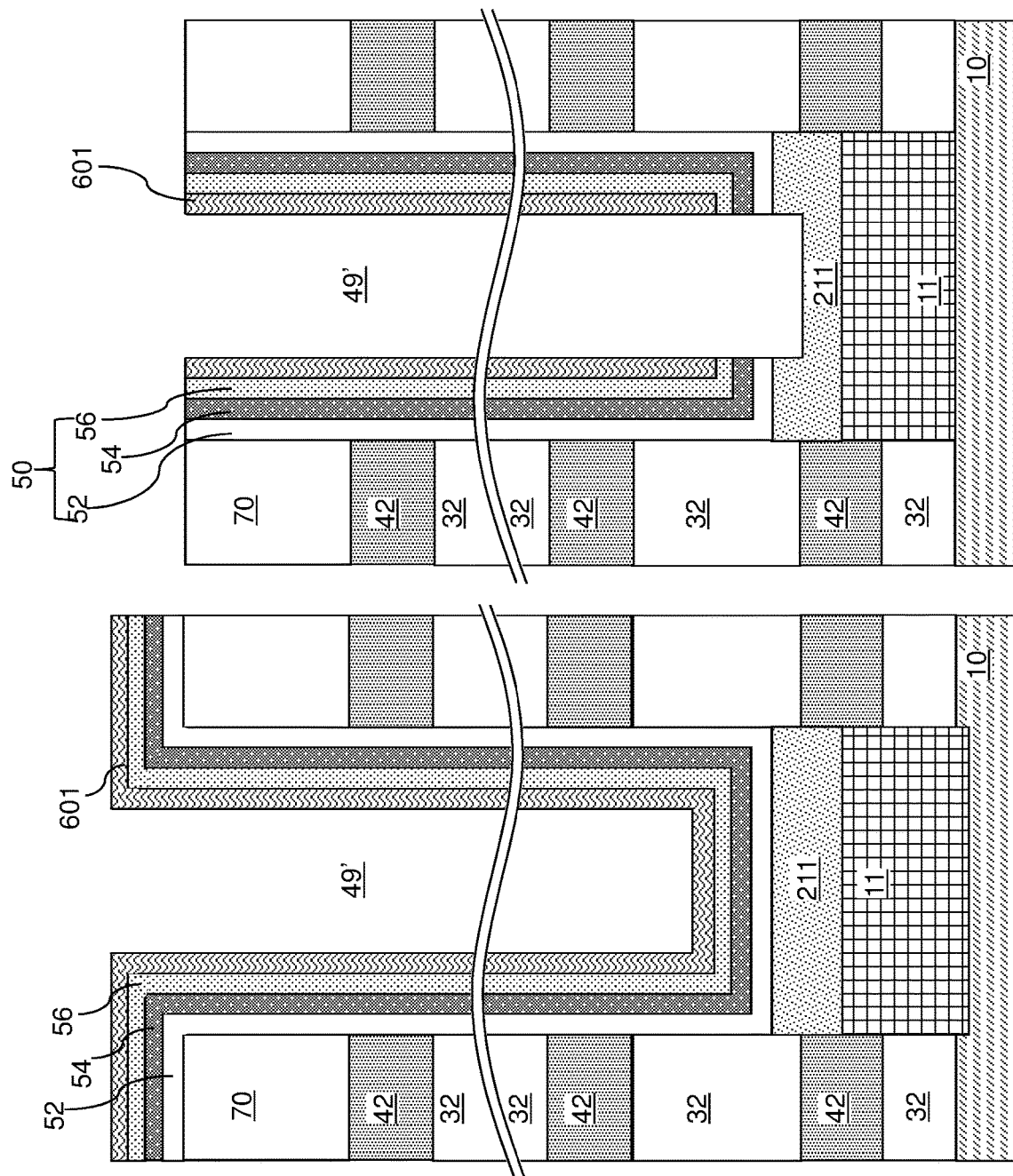

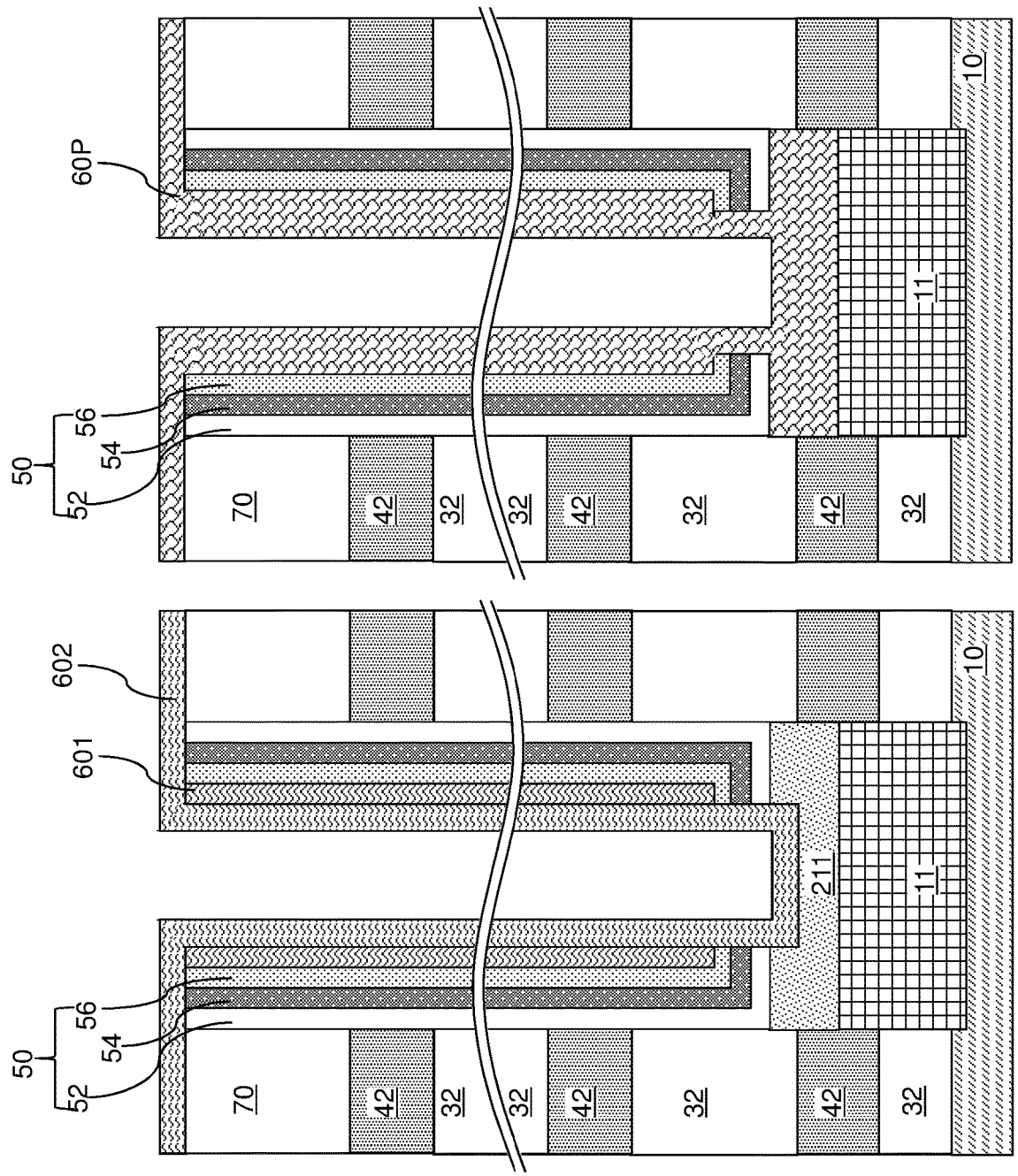

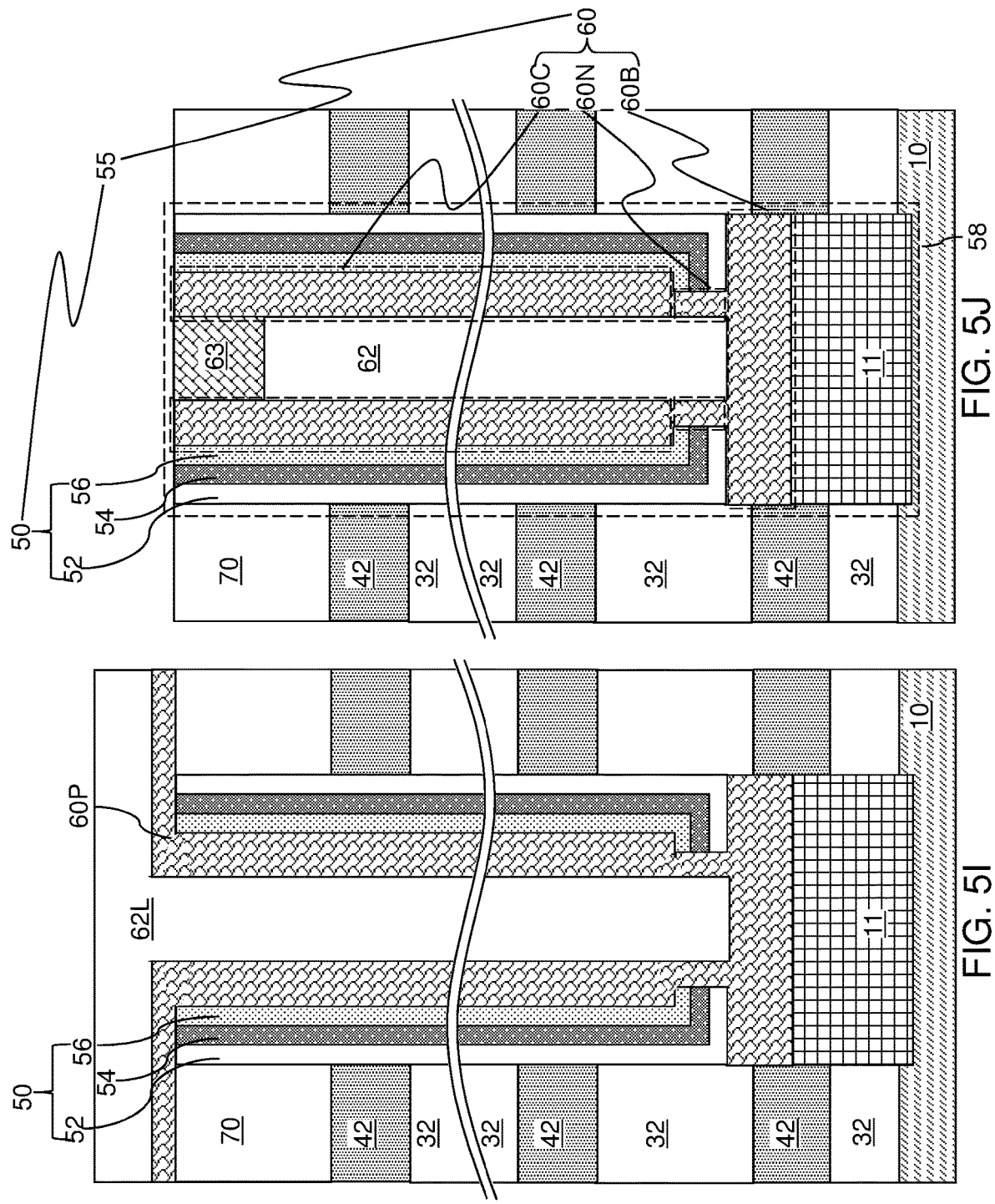

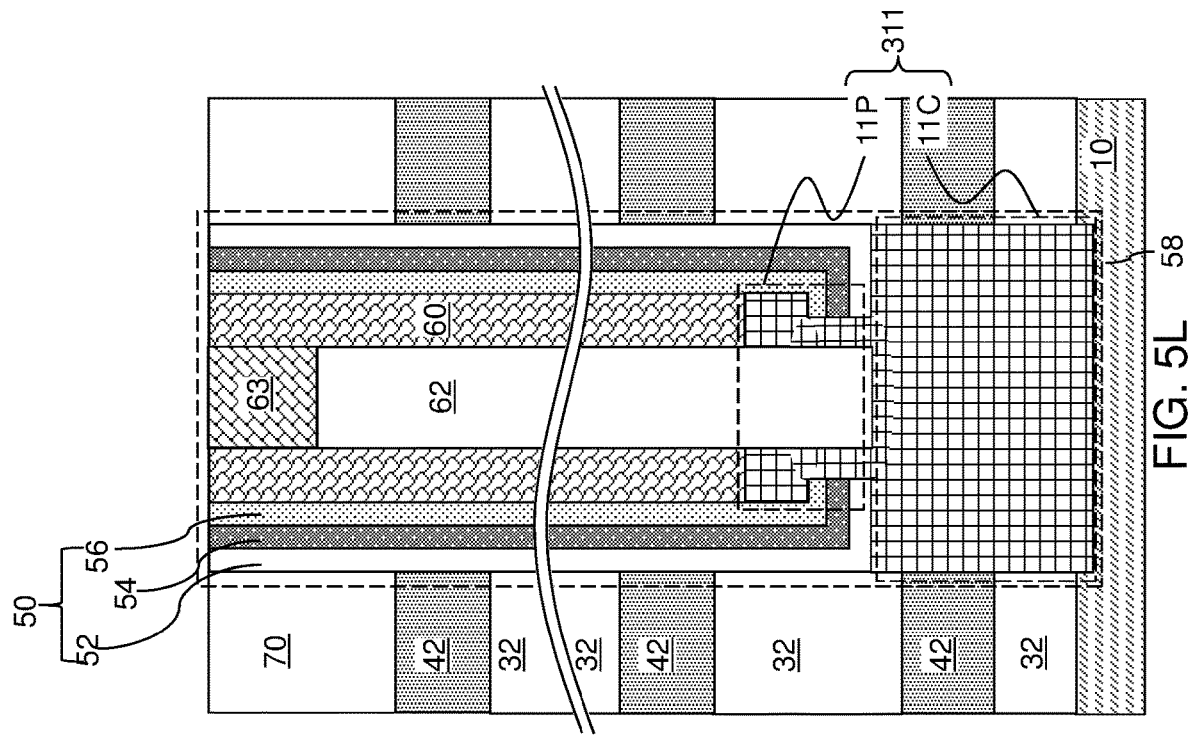
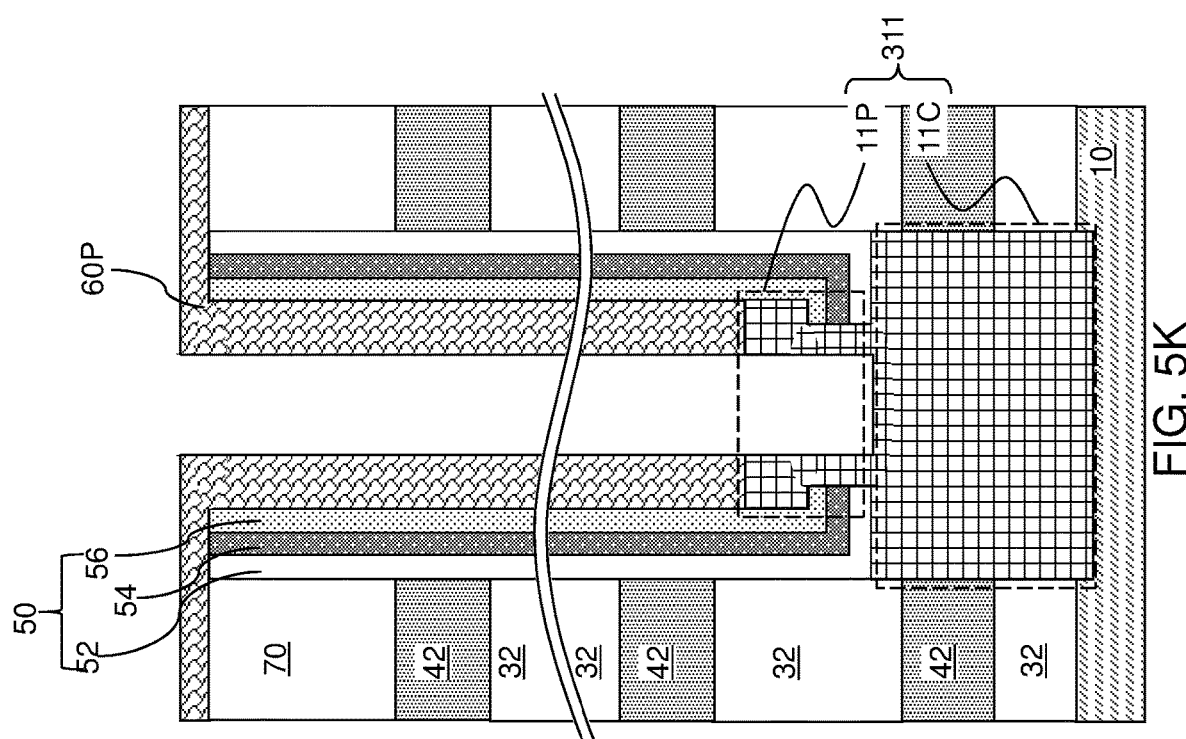

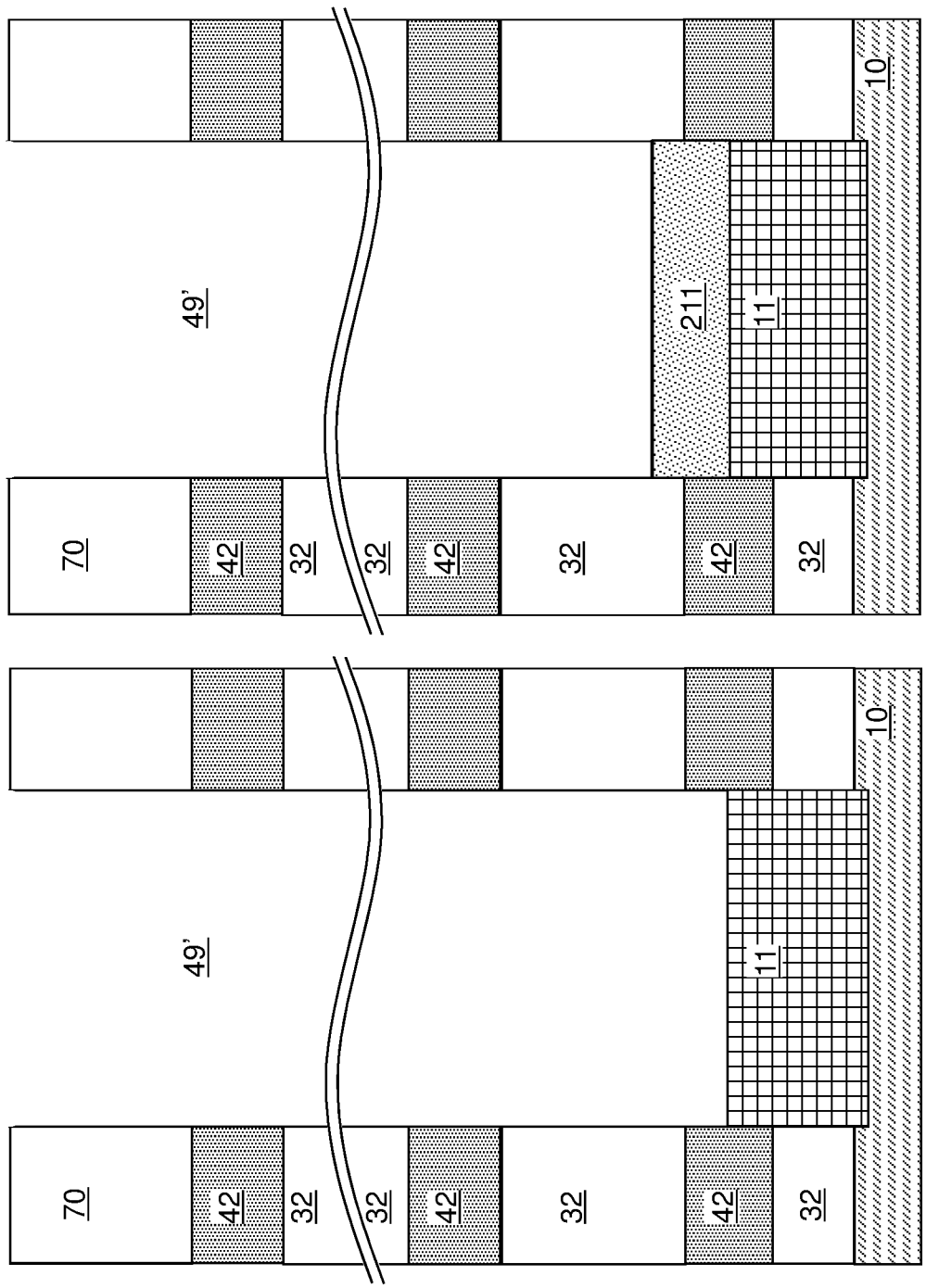

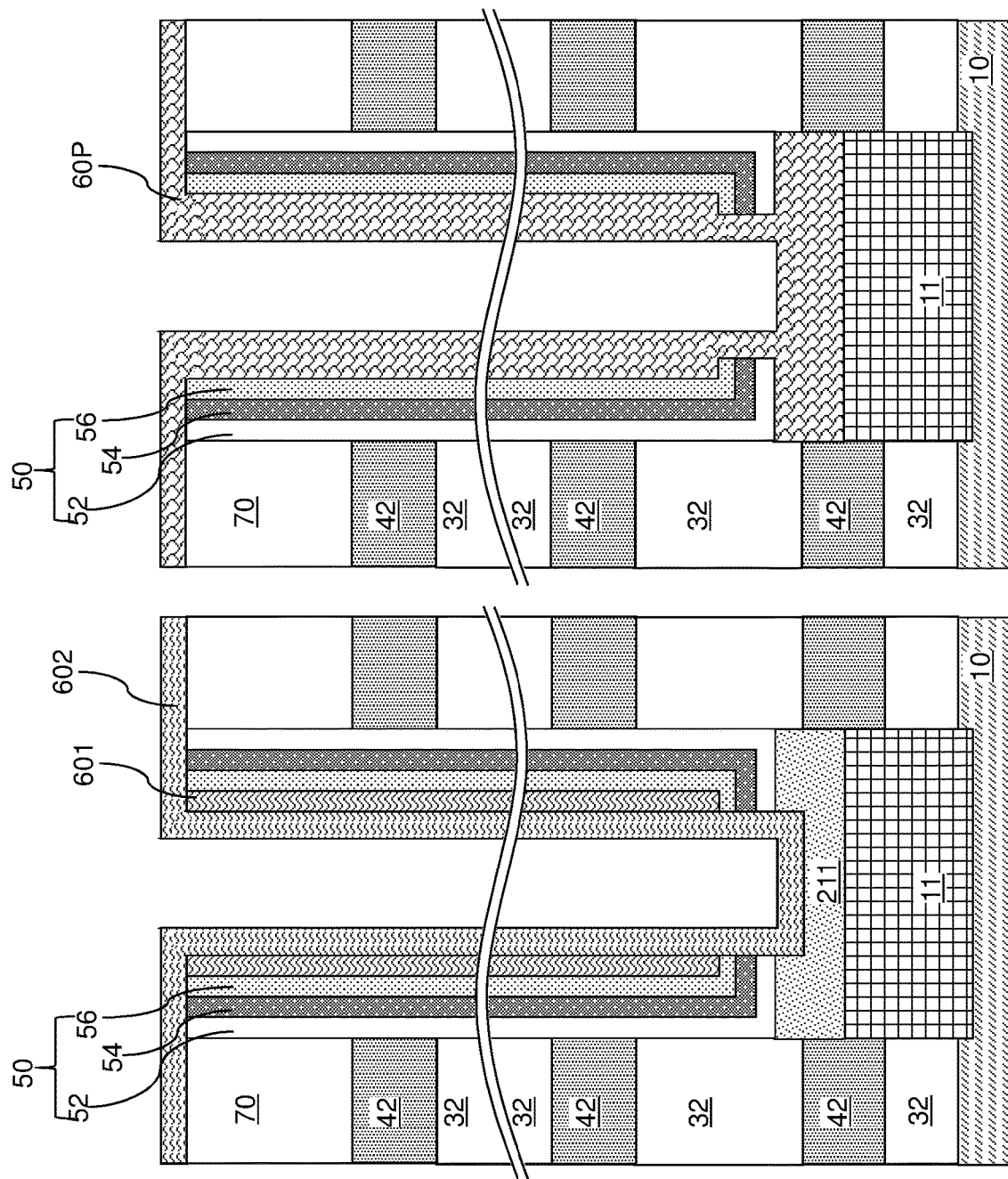

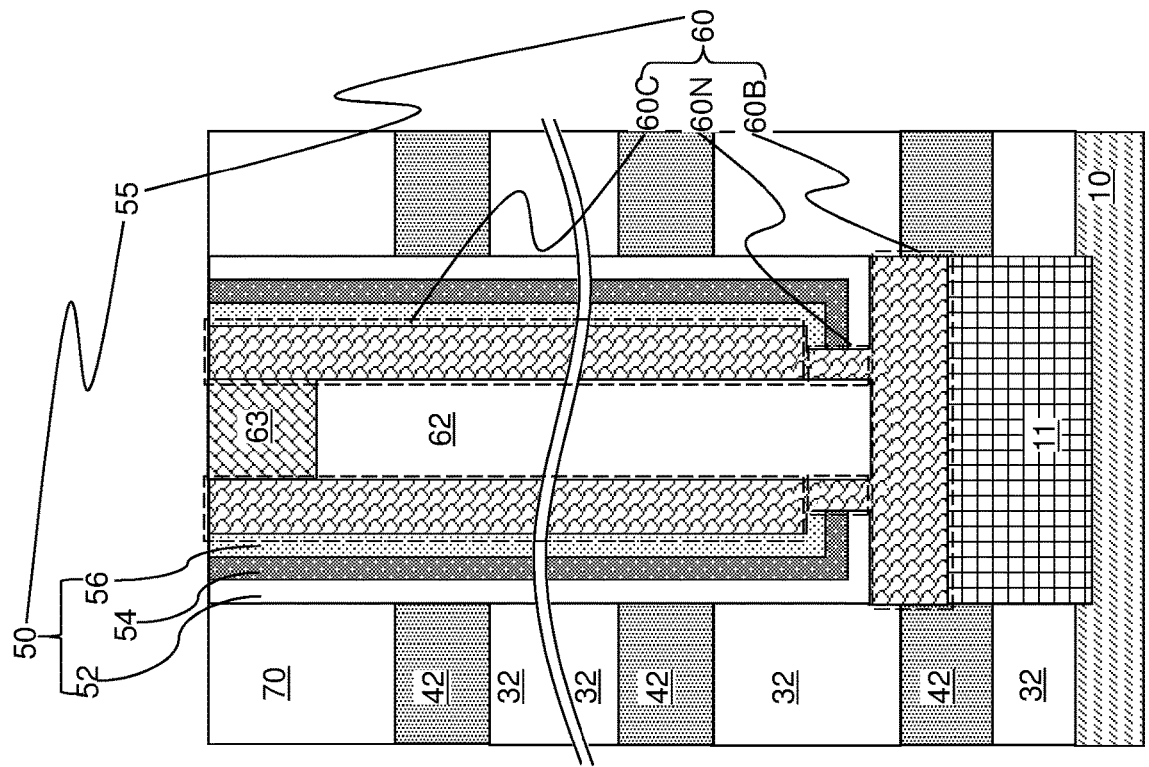
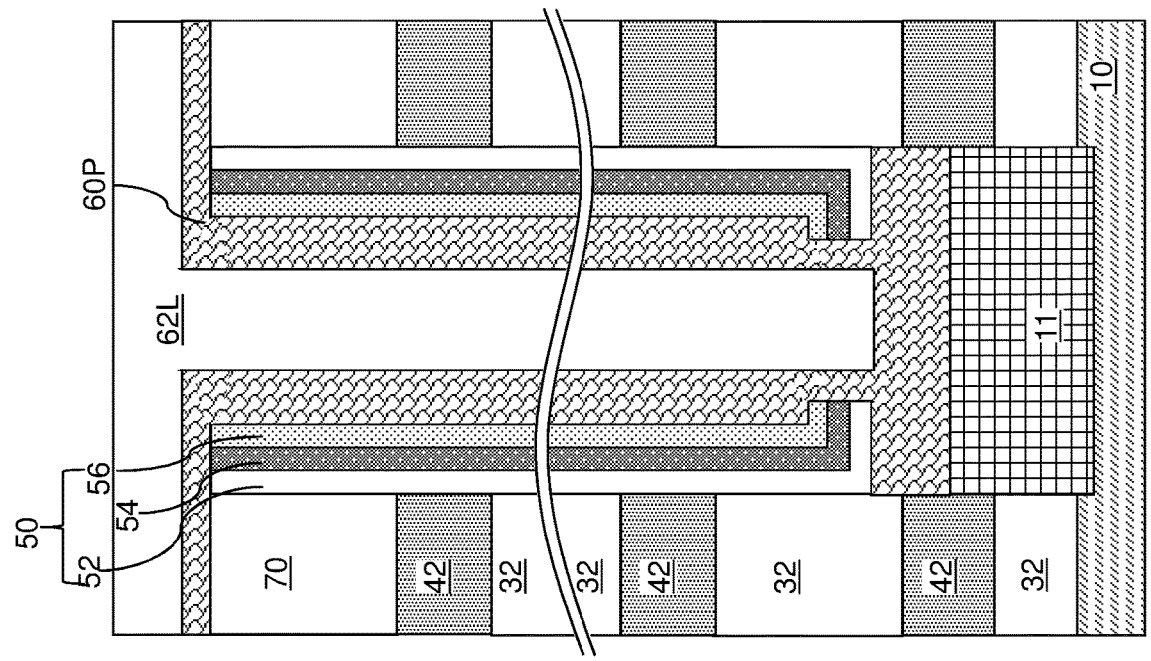
FIG. 6H
FIG. 6G

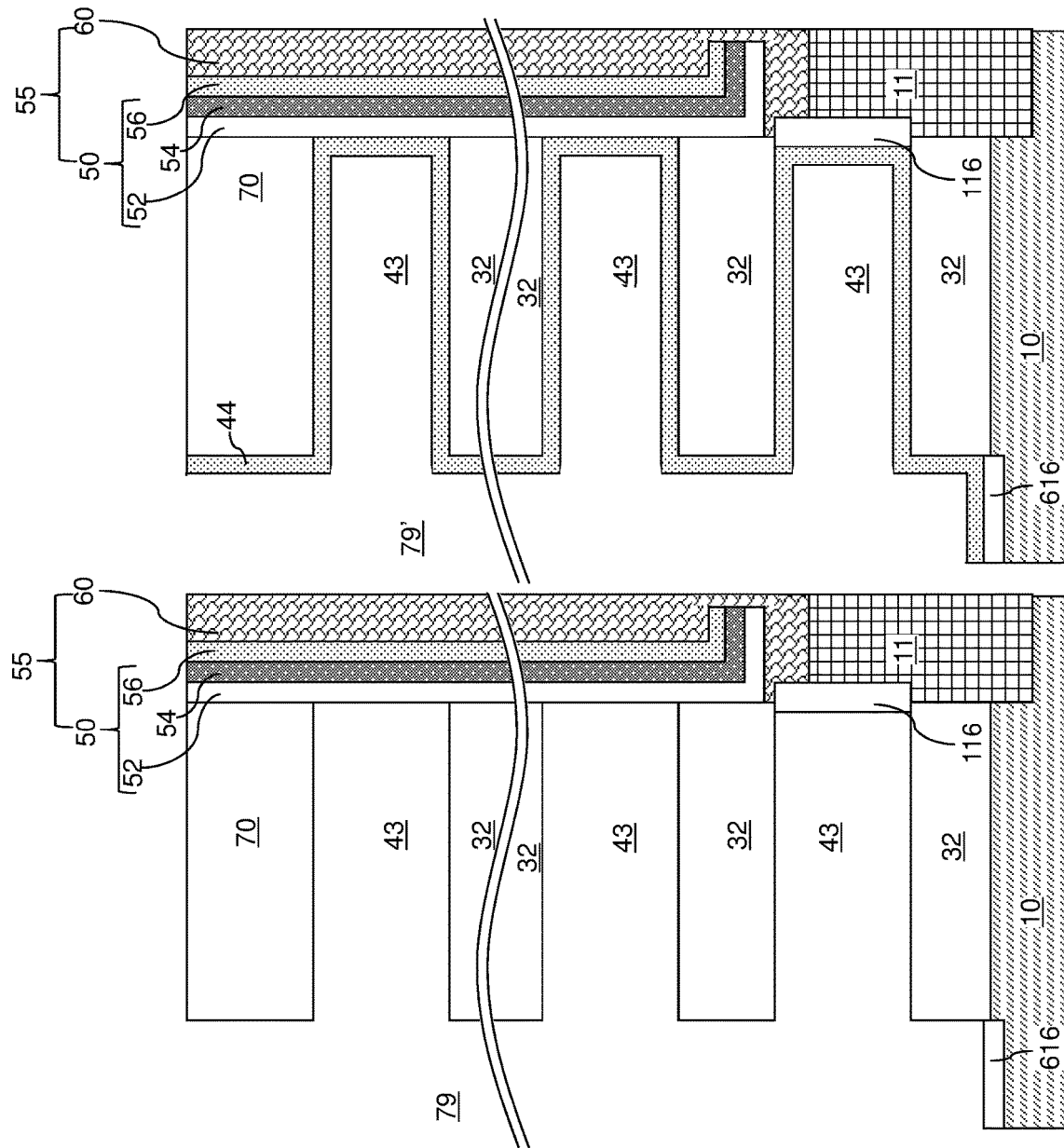

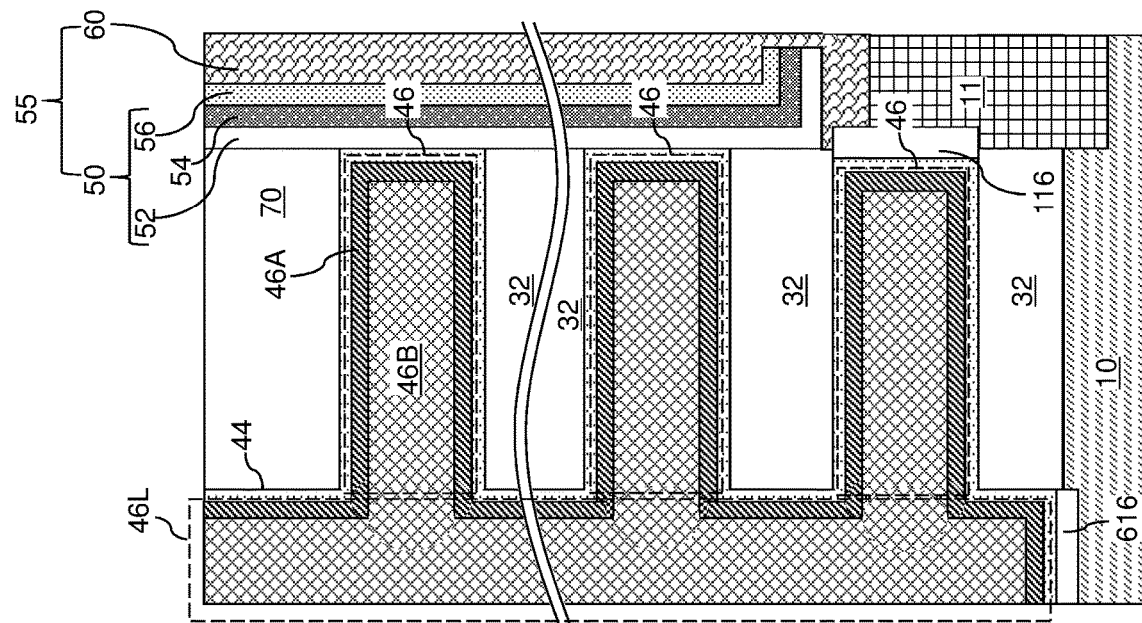
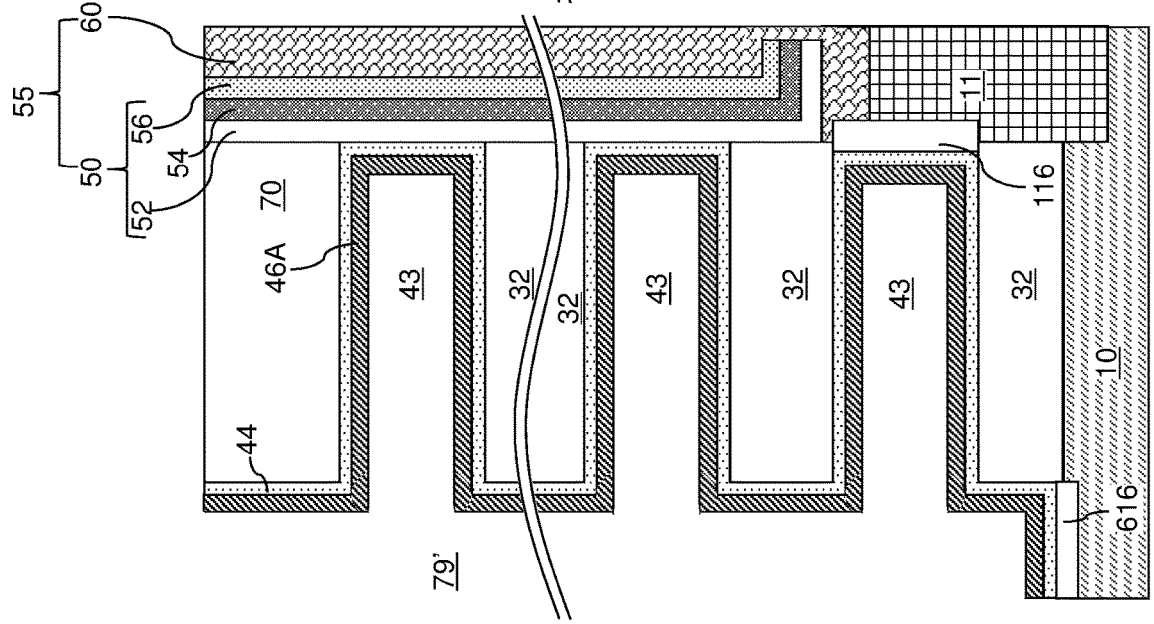
FIG. 10D
FIG. 10C

US 10,991,705 B2

THREE-DIMENSIONAL MEMORY DEVICE HAVING ENHANCED CONTACT BETWEEN POLYCRYSTALLINE CHANNEL AND EPITAXIAL PEDESTAL STRUCTURE AND METHOD OF MAKING THE SAME

FIELD

The present disclosure relates generally to the field of semiconductor devices, and particularly to a three-dimensional memory device including a polycrystalline semiconductor channel with enhanced contact to an underlying epitaxial pedestal structure in each memory opening and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional semiconductor device is provided, which comprises: an alternating stack of insulating layers and electrically conductive layers located over a substrate; memory openings vertically extending through the alternating stack; and memory opening fill structures located within a respective one of the memory openings, wherein each of the memory opening fill structures comprises: a memory film contacting a sidewall of a respective memory opening, and including an opening in an annular bottom portion thereof; and a vertical semiconductor channel including a polycrystalline cylindrical portion contacting an inner sidewall of a vertically-extending portion of the memory film, a polycrystalline neck portion extending through the opening in the annular bottom portion of the memory film, and a polycrystalline base portion contacting an annular bottom surface of the annular bottom portion of the memory film.

According to another embodiment of the present disclosure, a method of forming a three-dimensional semiconductor device is provided, which comprises the steps of: forming an alternating stack of insulating layers and spacer material layers over a substrate, wherein the spacer material layers are formed as, or are subsequently replaced with, electrically conductive layers; forming a memory opening through the alternating stack; forming an amorphous semiconductor material portion at a bottom region of the memory opening; forming a memory film in the memory opening, wherein the memory film includes an opening at a bottom portion thereof, and a surface of the amorphous semiconductor material portion is physically exposed at a bottom of the opening of the memory film; forming an amorphous semiconductor channel material layer on a top surface of the amorphous semiconductor material portion and over the memory film; and forming a vertical semiconductor channel by annealing the amorphous semiconductor material portion and the amorphous semiconductor channel material layer, wherein the vertical semiconductor channel comprises a polycrystalline cylindrical portion contacting an inner sidewall of a vertically-extending portion of the memory film, a polycrystalline neck portion extending through the opening in the memory film, and a polycrystalline base portion contacting an annular bottom surface of the memory film.

According to another embodiment of the present disclosure, a three-dimensional memory device includes an alternating stack of insulating layers and electrically conductive layers located over a substrate; memory openings vertically extending through the alternating stack; and memory opening fill structures located within a respective one of the memory openings, wherein each of the memory opening fill structures comprises: a memory film contacting a sidewall of a respective memory opening and including an opening at a bottom portion thereof; an epitaxial pedestal structure comprising a single crystalline semiconductor material and including a cylindrical portion located underneath a bottom surface of the memory film and a protrusion portion having a tubular configuration and extending through the opening in the memory film; and a vertical semiconductor channel contacting an inner sidewall of the memory film and overlying and contacting the protrusion portion of the epitaxial pedestal structure.

According to another embodiment of the present disclosure, a method of forming a three-dimensional semiconductor device includes forming an alternating stack of insulating layers and spacer material layers over a substrate, wherein the spacer material layers are formed as, or are subsequently replaced with, electrically conductive layers; forming a memory opening through the alternating stack; forming a vertical stack, from bottom to top, of an in-process epitaxial pedestal structure and an amorphous semiconductor material portion at a bottom region of the memory opening, wherein the in-process epitaxial pedestal structure comprises a single crystalline epitaxial semiconductor material; forming a memory film in the memory opening, wherein the memory film includes an opening in a bottom portion thereof, and a surface of the amorphous semiconductor material portion is physically in the opening in the memory film; forming an amorphous semiconductor channel material layer contacting the exposed surface of the amorphous semiconductor material portion and over the memory film; and inducing solid phase epitaxial growth in the amorphous semiconductor material portion and in a lower portion of the amorphous semiconductor channel material layer using the in-process epitaxial pedestal structure as a growth template, wherein the amorphous semiconductor material portion and the lower portion of the amorphous semiconductor channel material layer are converted into single crystalline epitaxial semiconductor material portions that are added to the in-process epitaxial pedestal structure to form an epitaxial pedestal structure, and an upper portion of the amorphous semiconductor channel material layer is converted into a vertical semiconductor channel including a polycrystalline semiconductor material.

BRIEF DESCRIPTION OF THE DRAWINGS

FIGS. 5A-5J are sequential schematic vertical cross-sectional views of a memory opening during formation of a first exemplary memory opening fill structure therein according to an first embodiment of the present disclosure.

FIGS. 5K-5L are sequential schematic vertical cross-sectional views of a memory opening during formation of a second exemplary memory opening fill structure therein according to a second embodiment of the present disclosure.

FIGS. 6A-6H are sequential schematic vertical cross-sectional views of a memory opening during formation of a third exemplary memory opening fill structure therein according to a third embodiment of the present disclosure.

FIGS. 10A-10D are sequential vertical cross-sectional views of a region of the first and third exemplary structures during formation of electrically conductive layers according to first and third embodiments of the present disclosure.

DETAILED DESCRIPTION

Figure 1:
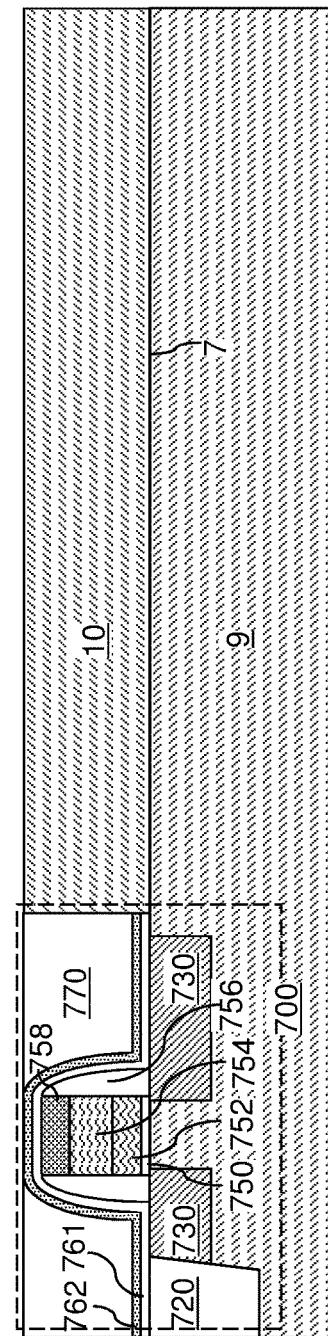
FIG. 1 is a schematic vertical cross-sectional view of an exemplary structure after formation of at least one peripheral device and a semiconductor material layer according to the embodiments of the present disclosure.

As discussed above, the present disclosure is directed to a three-dimensional memory device including a polycrystalline semiconductor channel with enhanced contact to an underlying epitaxial pedestal structure in each memory opening and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, an exemplary structure according to first through fourth embodiments of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The entirety of the substrate semiconductor layer 9 can be single crystalline, such as when the substrate semiconductor layer 9 comprises a single crystal silicon wafer. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

At least one semiconductor device 700 for a peripheral circuitry may optionally be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by doping (e.g., ion implantation or diffusion) or by deposition of a single crystalline semiconductor material, for example, by selective epitaxy. The optional semiconductor material layer 10, if present, may be a doped well in the substrate semiconductor layer 9 or it may be a single crystalline layer (e.g., single crystal silicon layer) that is deposited on and is in epitaxial alignment with the single crystalline substrate semiconductor material of the substrate semiconductor layer 9. The material of the semiconductor material layer 10 may be the same as, or can be different from, the semiconductor material of the substrate semiconductor layer 9. If the semiconductor material layer 10 is deposited on the substrate semiconductor layer 9, then portions of the deposited semiconductor material layer 10 located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In an alternative embodiment, the peripheral device region 200 containing the at least one semiconductor device 700 is not formed on the same substrate (9, 10) as the memory array region 100. Instead, the peripheral device region 200 containing the at least one semiconductor device 700 is formed on a separate substrate and is then bonded to the substrate (9, 10) containing the memory array region 100.

Figure 2:
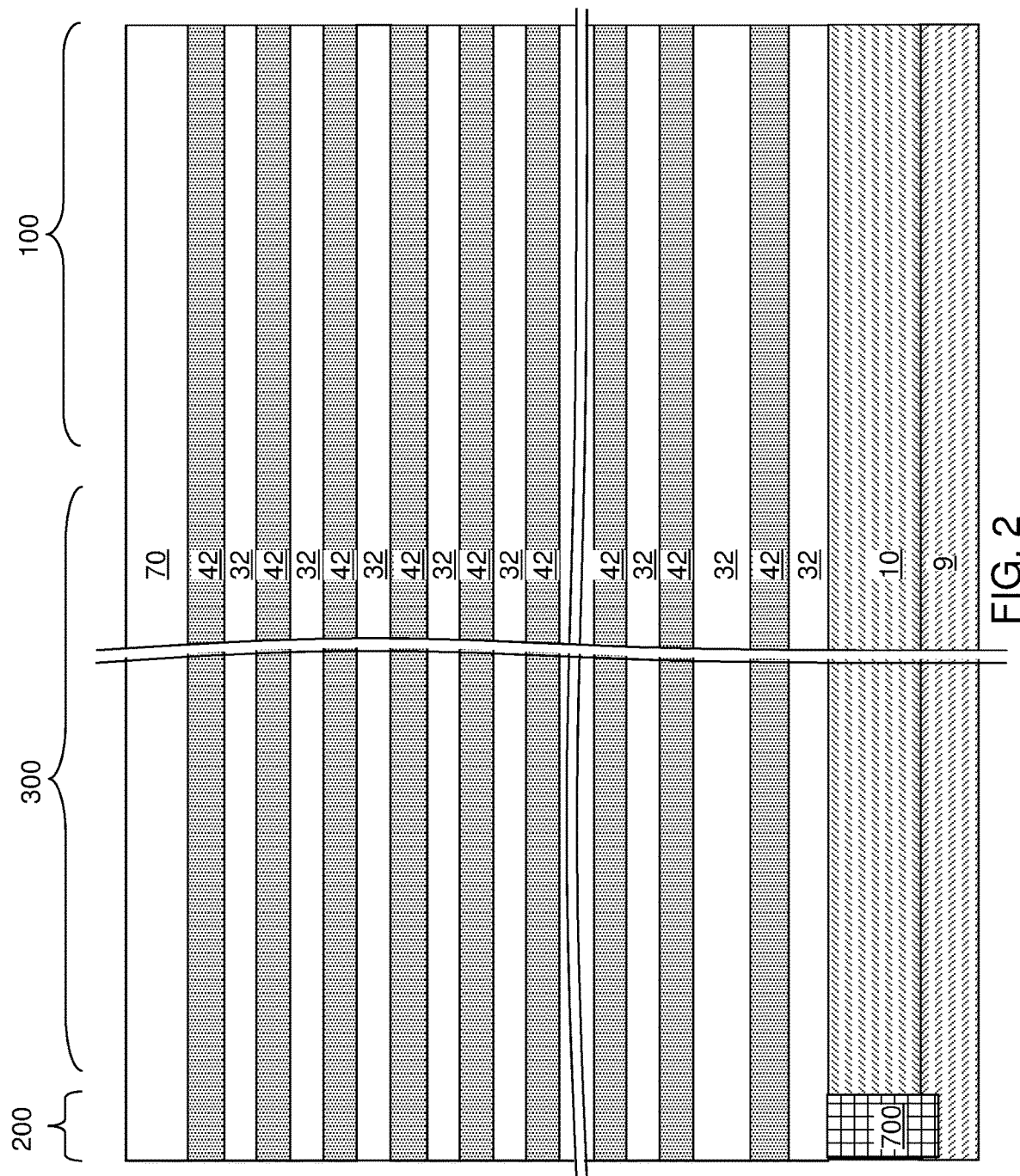
FIG. 2 is a schematic vertical cross-sectional view of the exemplary structure after formation of an alternating stack of insulating layers and sacrificial material layers according to the embodiments of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethylorthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing the embodiments in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
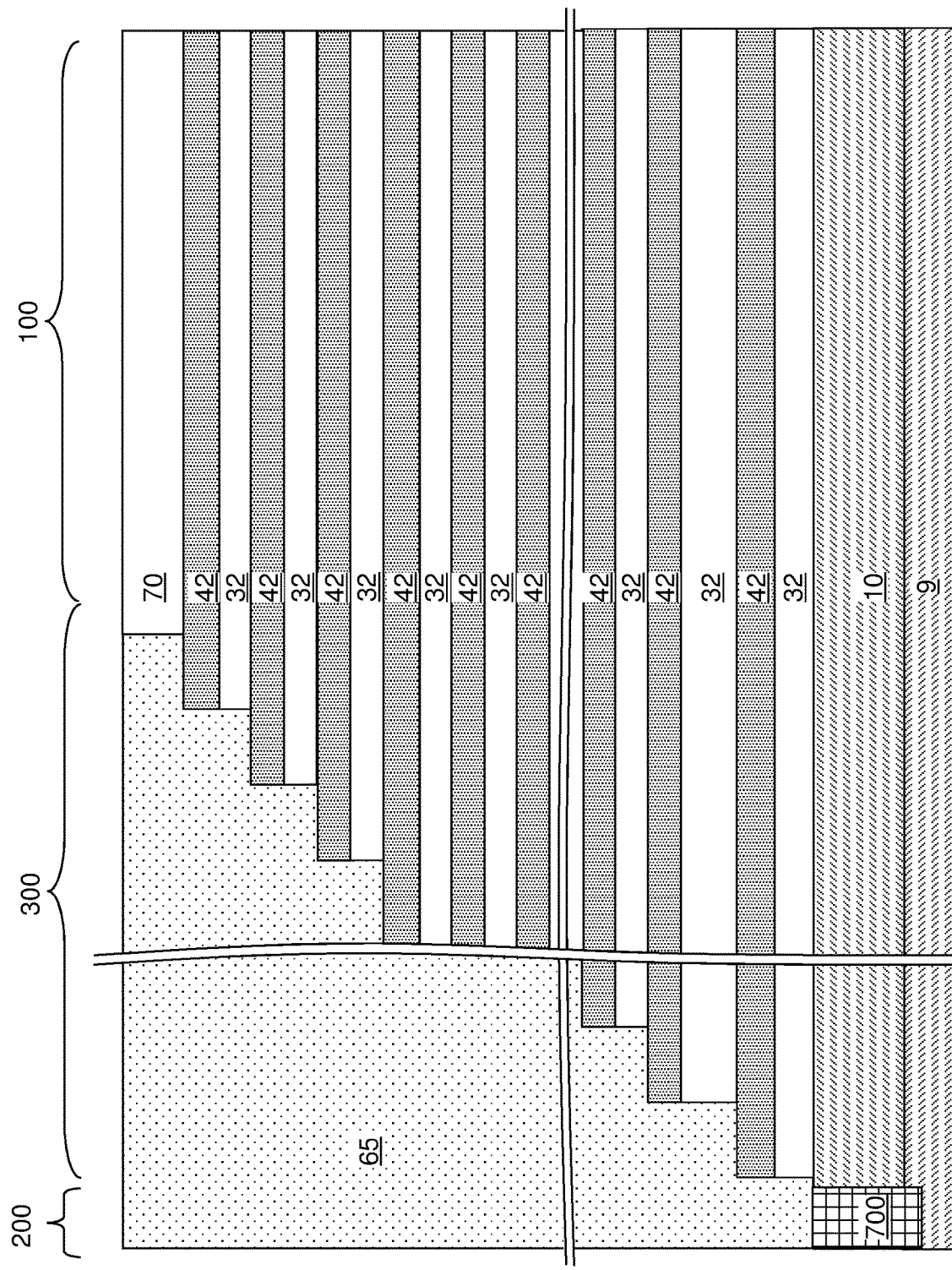
FIG. 3 is a schematic vertical cross-sectional view of the exemplary structure after formation of stepped terraces and a retro-stepped dielectric material portion according to the embodiments of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
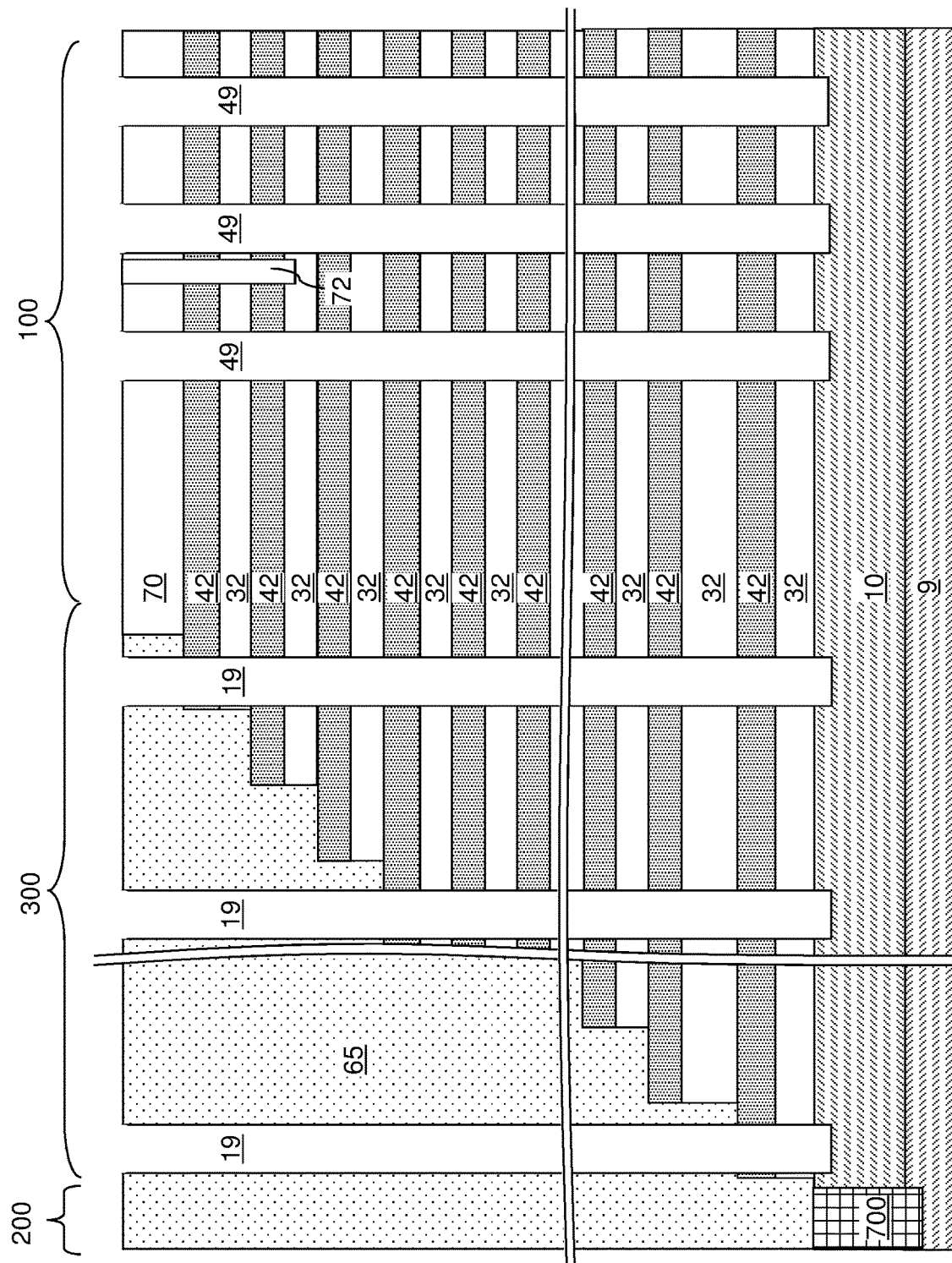
FIG. 4A is a schematic vertical cross-sectional view of the exemplary structure after formation of memory openings and support openings according to the embodiments of the present disclosure.
Figure 4B:
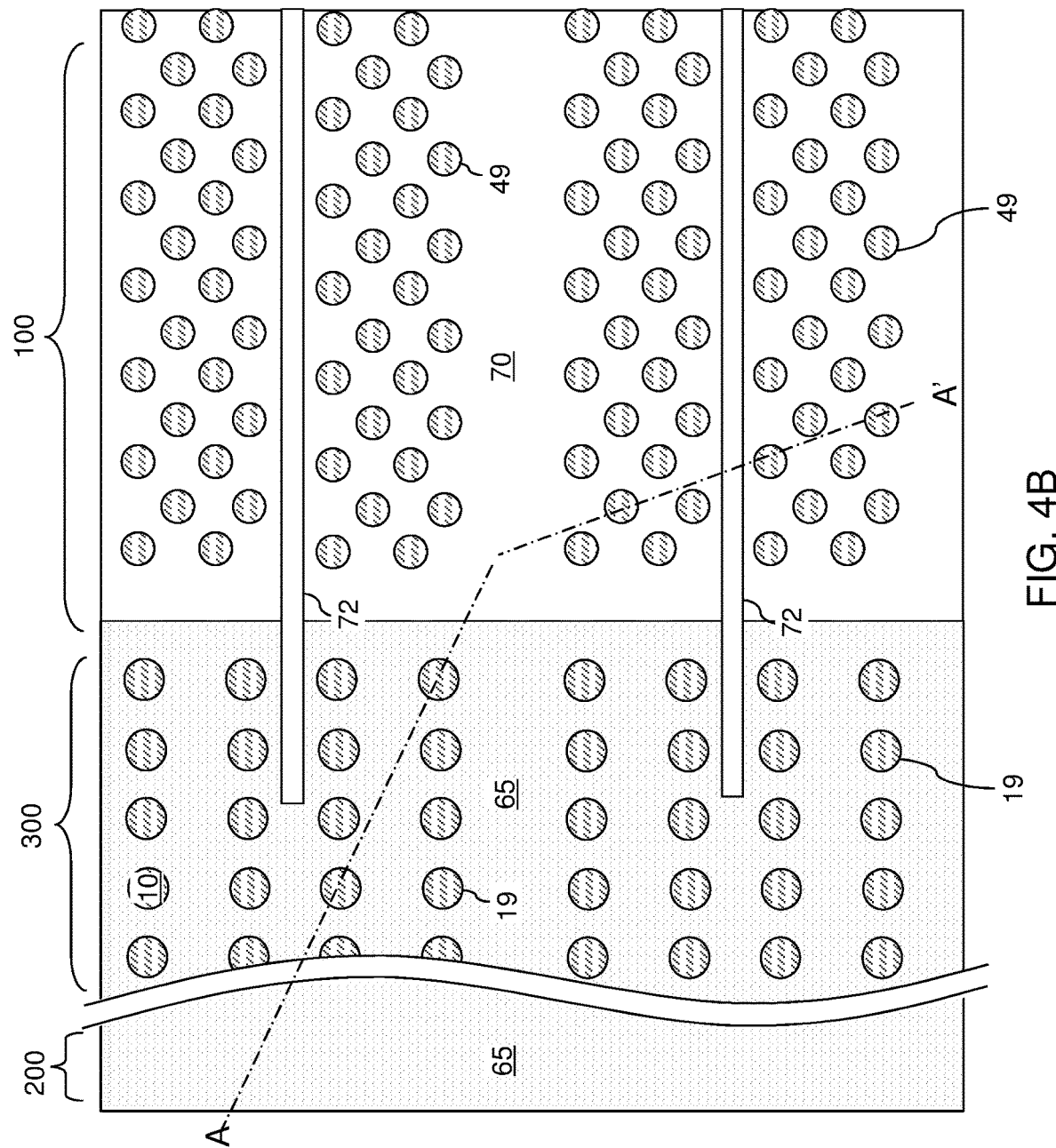
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49 during formation of a first exemplary memory opening fill structure according to the first embodiment. The illustrated memory opening 49 can be any of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an epitaxial pedestal structure 11 can be formed at the bottom portion of each memory opening 49 and each support openings 19, for example, by selective epitaxy. The epitaxial pedestal structure 11 can be formed by epitaxial growth of a single crystalline semiconductor material (which is herein referred to as a single crystalline pedestal semiconductor material) at a bottom portion of each memory opening 49 and at a bottom portion of each support opening 19. In one embodiment, the top surface of each epitaxial pedestal structure 11 can be formed above a horizontal plane including the top surface of a bottommost sacrificial material layer 42. In this case, a source select gate electrode can be subsequently formed by replacing the bottommost sacrificial material layer 42 with a conductive material layer. The epitaxial pedestal structure 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the epitaxial pedestal structure 11. In one embodiment, the epitaxial pedestal structure 11 can comprise single crystalline silicon. In one embodiment, the epitaxial pedestal structure 11 can have a doping of the first conductivity type, which is the same as the conductivity type of the semiconductor material layer 10 that the epitaxial pedestal structure contacts. If a semiconductor material layer 10 is not present, the epitaxial pedestal structure 11 can be formed directly on the substrate semiconductor layer 9, which can have a doping of the first conductivity type. Thus, each epitaxial pedestal structure 11 comprises a single crystalline semiconductor material (e.g., single crystal silicon) in epitaxial alignment with the single crystalline semiconductor material (e.g., single crystal silicon) of the semiconductor material layer 10 (if present) or of the substrate semiconductor layer 9. In one embodiment, the epitaxial pedestal structure 11 can have a doping of the first conductivity type (e.g., p-type conductivity). The atomic concentration of dopants of the first conductivity type in the epitaxial pedestal structures 11 can be in a range from $1.0 \times 10^{14}/cm^3$ to $3.0 \times 10^{17}/cm^3$, although lesser and greater atomic concentrations can also be employed. The height of the epitaxial pedestal structure 11 can be in a range from 40 nm to 200 nm, although lesser and greater heights can also be employed.

Referring to FIG. 5C, a blocking dielectric layer 52 can be deposited on the physically exposed surfaces of the epitaxial pedestal structures 11 and the physically exposed sidewalls of the layers within the alternating stack (32, 42). The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Referring to FIG. 5D, dopants can be implanted into an upper portion of the epitaxial pedestal structure 11 within each memory opening. The dopants can include dopants that do not impart an electrical conductivity type, such as germanium, carbon and/or argon, to a silicon epitaxial pedestal structure 11, or can include dopants of the first conductivity type (e.g., boron for a silicon epitaxial pedestal structure 11). If the blocking dielectric later 52 is present during the implantation step, then the dopants are implanted through the blocking dielectric layer. In one embodiment, the implanted atoms amorphize the upper portion of the epitaxial pedestal structure 11 and converts the upper portion of the epitaxial pedestal structure 11 into an amorphous semiconductor material portion 211. The dose of the implanted dopants can be selected such that the implanted portion of the pedestal structure is amorphized. The implanted amorphized portions of the epitaxial pedestal structure 11 forms an amorphous semiconductor material portion 211, such as an amorphous silicon portion at a bottom region of the memory opening 49 below the blocking dielectric layer 52 (if present). The atomic concentration of the implanted dopants in the amorphous semiconductor material portion 211 can be in a range from $1.0 \times 10^{19}/cm^3$ to $2.0 \times 10^{21}/cm^3$, although lesser and greater atomic concentrations can also be employed. The thickness of the amorphous semiconductor material portion 211 can be in a range from 10 nm to 80 nm, such as from 20 nm to 40 nm, although lesser and greater thicknesses can also be employed.

Referring to FIG. 5E, a stack of layers including a charge storage layer 54, a tunneling dielectric layer 56, and an amorphous cover semiconductor material layer 601 can be sequentially deposited in the memory openings 49. In an alternative method the blocking dielectric layer 52 is deposited after the implantation step shown in FIG. 5D and before deposition of the charge storage layer 54.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The amorphous cover semiconductor material layer 601 includes an amorphous semiconductor material such as at least one amorphous elemental semiconductor material, at least one amorphous III-V compound semiconductor material, at least one amorphous II-VI compound semiconductor material, or other amorphous semiconductor materials known in the art. In one embodiment, the amorphous cover semiconductor material layer 601 includes amorphous silicon. The amorphous cover semiconductor material layer 601 can be formed by a conformal deposition method such as low pressure chemical vapor deposition (LPCVD). The thickness of the amorphous cover semiconductor material layer 601 can be in a range from 2 nm to 10 nm, although lesser and greater thicknesses can also be employed.

Referring to FIG. 5F, the amorphous cover semiconductor material layer 601, the tunneling dielectric layer 56, the charge storage layer 54, and the blocking dielectric layer 52 are sequentially anisotropically etched employing at least one anisotropic etch process. The portions of the amorphous cover semiconductor material layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the amorphous cover semiconductor material layer 601, the tunneling dielectric layer 56, the charge storage layer 54, and the blocking dielectric layer 52 at a bottom of each memory cavity 49' can be removed to form openings through remaining portions thereof. Each of the amorphous cover semiconductor material layer 601, the tunneling dielectric layer 56, the charge storage layer 54, and the blocking dielectric layer 52 can be etched by a respective anisotropic etch process employing a respective etch chemistry, which may, or may not, be the same for the various material layers. An exposed center portion of each amorphous semiconductor material portion 211 can be recessed to provide a recessed top surface and an inner cylindrical sidewall that adjoins the recessed top surface to an unrecessed annular surface of the respective amorphous semiconductor material portion 211.

Each remaining portion of the amorphous cover semiconductor material layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

Surfaces of the amorphous semiconductor material portion 211 can be physically exposed underneath the opening through the amorphous cover semiconductor material layer 601, the tunneling dielectric layer 56, the charge storage layer 54, and the blocking dielectric layer 52. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising regions of the charge storage layer 54) that are insulated from surrounding materials by the blocking dielectric layer 52 and the tunneling dielectric layer 56. In one embodiment, the amorphous cover semiconductor material layer 601, the tunneling dielectric layer 56, the charge storage layer 54, and the blocking dielectric layer 52 can have vertically coincident sidewalls. As used herein, a first surface is "vertically coincident" with a second surface if the first surface overlies or underlies the second surface and if there exists a vertical plane including the first surface and the second surface.

A memory film 50 is formed in each memory opening 49. The memory film includes an opening at a bottom portion thereof. Each of the memory films 50 comprises a layer stack that includes a charge storage layer 54 containing a respective vertical stack of memory elements, and a tunneling dielectric layer 56 contacting an inner sidewall of the charge storage layer 54. The memory elements can be portions of the charge storage layer 54 located at the levels of the sacrificial material layers 42, which are subsequently replaced with electrically conductive layers. In one embodiment, the cover semiconductor material layer 601 is removed after this step. In another embodiment, the cover semiconductor material layer 601 is retained after this step.

Referring to FIG. 5G, an amorphous semiconductor channel material layer 602 including an amorphous semiconductor channel material can be conformally and non-selectively deposited directly on the semiconductor surface of the amorphous semiconductor material portion 211, and directly on the memory films 50 (if the cover semiconductor material layer 601 is removed). The material of the amorphous semiconductor material portion 211 and the amorphous semiconductor channel material layer 602 constitute a semiconductor channel material. As used herein, a "semiconductor channel material" refers to a semiconductor material that is employed to form a semiconductor channel of a field effect transistor. The amorphous semiconductor channel material layer 602 is deposited as an amorphous semiconductor material by selecting a deposition temperature which prevents crystallization of the deposited semiconductor channel material. The amorphous semiconductor channel material layer 602 includes an amorphous semiconductor material such as at least one elemental semiconductor material, at least one III-V compound semiconductor material, at least one II-VI compound semiconductor material, at least one organic semiconductor material, or other semiconductor materials known in the art. In one embodiment, the amorphous semiconductor channel material layer 602 includes amorphous silicon. The amorphous semiconductor channel material layer 602 can be formed by a conformal deposition method such as low pressure chemical vapor deposition (LPCVD). For example, if low pressure chemical vapor deposition process employing silane as a precursor gas is used to deposit amorphous silicon by thermal decomposition of silane, deposition temperature less than 570 degrees Celsius can be employed to deposit amorphous silicon. The amorphous semiconductor channel material layer 602 may partially fill the memory cavity 49' in each memory opening 49, or may fully fill the cavity in each memory opening 49. The amorphous semiconductor channel material layer 602 can have a doping of the first conductivity type. The atomic concentration of dopants of the first conductivity type in the amorphous semiconductor channel material layer 602 can be in a range from $1.0\times10^{14}/cm^3$ to $3.0\times10^{17}/cm^3$, although lesser and greater atomic concentrations can also be employed. The thickness of the amorphous semiconductor channel material layer 602 can be in range from 2 nm to 40 nm, such as from 4 nm to 20 nm, although lesser and greater thicknesses can also be employed.

Referring to FIG. 5H, an anneal process can be performed to covert the amorphous semiconductor channel material in the amorphous semiconductor material portion 211 and the amorphous semiconductor channel material layer 602 into polycrystalline semiconductor material portions. A rapid thermal anneal (RTA) process can be employed to convert the amorphous semiconductor channel material in the amorphous semiconductor material portion 211 and the amorphous semiconductor channel material layer 602 into the polycrystalline semiconductor material portions. The peak temperature of the RTA process can be in a range from 950 degrees Celsius to 1050 degrees Celsius, and the duration of the peak temperature can be in a range from 0.1 second to 10 seconds. Alternatively, a furnace anneal may be employed to convert the amorphous semiconductor channel material in the amorphous semiconductor material portion 211 and the amorphous semiconductor channel material layer 602 into the polycrystalline semiconductor material portions. The polycrystalline semiconductor material portions constitute a polycrystalline semiconductor channel material layer 60P, such as a polysilicon layer.

Referring to FIG. 5I, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5J, portions of the dielectric core layer 62L can be removed, for example, by a recess etch that etches the material of the dielectric core layer 62L selective to the material of the polycrystalline semiconductor channel material layer 60P. An isotropic etch process such as a wet etch process or an anisotropic etch process such as a reactive ion etch process may be employed. The dielectric material of the dielectric core layer 62L can be recessed such that the top surface of each remaining portion of the dielectric core layer 62L is formed between the horizontal plane including the top surface of the insulating cap layer 70 and the horizontal plane including the bottom surface of the insulating cap layer 70. Each remaining portion of the dielectric core layer 62L constitutes a dielectric core 62.

Further, the horizontal portion of the polycrystalline semiconductor channel material layer 60P located above the top surface of the insulating cap layer 70 can be removed by an anisotropic etch process such as a reactive ion etch process. Each discrete remaining portion of the polycrystalline semiconductor channel material layer 60P constitutes a vertical semiconductor channel 60, which can consist of a polycrystalline semiconductor material, such as polysilicon. Each vertical semiconductor channel 60 is formed on an inner sidewall of a respective memory film 50. Each vertical semiconductor channel 60 can be located entirety within a memory opening 49 or entirely within a support opening 19.

Thus, the vertical semiconductor channels 60 are formed by annealing and patterning the amorphous semiconductor material portion 211, the amorphous cover semiconductor material layer 601 (if present), and the amorphous semiconductor channel material layer 602. Each vertical semiconductor channel 60 comprises a polycrystalline cylindrical portion 60C contacting an inner sidewall of a vertically-extending portion of the memory film 50, a polycrystalline neck portion 60N extending through the opening in the memory film 50, and a polycrystalline base portion 60B contacting an annular bottom surface of the memory film 50. Thus, including the amorphous semiconductor material portion 211 results in a wider and higher quality interface between the vertical semiconductor channel and the epitaxial pedestal structure, which improves the current flow and performance of the memory device.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. The entirety of each drain region 63 can be polycrystalline. Each drain region 63 is formed at upper end of a respective vertical semiconductor channel 60.

A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of an epitaxial pedestal structure 11, a memory stack structure 55, a dielectric core 62, and a drain region 63 within a memory opening 49 is herein referred to as a memory opening fill structure 58. Each combination of an epitaxial pedestal structure 11, a memory stack structure 55, a dielectric core 62, and a drain region 63 within each support opening 19 fills the respective support openings 19, and constitutes a support pillar structure.

FIGS. 5L-5K are sequential schematic vertical cross-sectional views of a memory opening during formation of a second exemplary memory opening fill structure therein according to a second embodiment of the present disclosure.

Referring to FIG. 5L, the second embodiment of the exemplary structure of the present disclosure can be derived from the first exemplary structure of the first embodiment after the processing steps of FIG. 5G. Instead of the crystallization anneal which forms the polycrystalline semiconductor channel material layer 60P, a solid phase crystallization anneal may be performed instead to extend the single crystalline semiconductor material of the epitaxial pedestal portion into the semiconductor channel material layer 602.

Referring to FIG. 5L, solid phase epitaxial growth can be induced in the amorphous semiconductor material portion 211, in a lower portion of the amorphous semiconductor channel material layer 602, and in a lower portion of the amorphous cover semiconductor material layer 601. Solid phase epitaxial growth or solid phase epitaxy refers to a transition from an amorphous phase material to a single crystalline phase of the material in which a single crystalline template material that contacts the amorphous phase material functions as a crystallization template for aligning crystallographic orientation of the crystalline phase of the material. An anneal process is employed during the solid phase epitaxial growth. The temperature of the anneal process is selected such that atoms of the material in the amorphous phase have sufficient mobility to nucleate on the single crystalline template material, but does not have enough mobility to start nucleation among atoms in the amorphous phase. In other words, the anneal temperature of the solid phase epitaxial growth is selected within a temperature range that is above a first critical temperature above which nucleation of the amorphous material on the single crystalline template material is enabled, and below a second critical temperature above which nucleation of atoms in an amorphous phase spontaneously occurs. In case the second critical temperature is close to, or is the same as, the first critical temperature, the anneal temperature is kept as close to the first temperature as possible to minimize collateral crystallization of portions of the amorphous material into polycrystalline material portions without alignment to the crystalline substrate.

In one embodiment, if the amorphous semiconductor material portion 211 comprises amorphous silicon, the anneal temperature of the solid phase epitaxial growth can be in a range from 570 degrees Celsius and 620 degrees Celsius. If temperature ramp is employed during the solid phase epitaxial growth, the temperature ramp rate can be small enough to prevent spontaneous crystallization of the amorphous material without crystallographic alignment to the crystalline structure of the in-process epitaxial pedestal structure 11. The temperature during the solid phase epitaxial growth is kept below the second critical temperature above which the amorphous materials of the amorphous semiconductor material portion 211, the amorphous semi-conductor channel material layer 602, and the amorphous cover semiconductor material layer 601 (if present) nucleate spontaneously without epitaxial alignment to the in-process epitaxial pedestal structure 11. The duration of the solid phase epitaxial growth can be in a range from 10 minutes to 24 hours, such as from 30 minutes to 6 hours, although lesser and greater durations can also be employed.

The in-process epitaxial pedestal structure 11 is used as a single crystalline template during the solid phase epitaxy process. The entirety of the amorphous semiconductor material portion 211, the lower portion of the amorphous semiconductor channel material layer 602, and the lower portion of the amorphous cover semiconductor material layer 601 (if present) are converted into single crystalline epitaxial semiconductor material portions that are added to the in-process epitaxial pedestal structure 11 to form an epitaxial pedestal structure 311. As such, the epitaxial pedestal structure 311 includes the in-process epitaxial pedestal structure 11, a single crystalline semiconductor material portion that is derived from the amorphous semiconductor material portion 211 and is in epitaxial alignment with the in-process epitaxial pedestal structure 11, a single crystalline semiconductor material portion that is derived from the lower portion of the amorphous semiconductor channel material layer 602 and is in epitaxial alignment with the in-process epitaxial pedestal structure 11, and an optional single crystalline semiconductor material portion that is derived from the lower portion of the amorphous cover semiconductor material layer 601 and is in epitaxial alignment with the in-process epitaxial pedestal structure 11.

An upper portion of the amorphous semiconductor channel material layer 602 and an upper portion of the amorphous cover semiconductor material layer 601 (if present) can be converted into a polycrystalline semiconductor channel material layer 60P (e.g., polysilicon) that includes a vertical semiconductor channel. Conversion of the upper portion of the amorphous semiconductor channel material layer 602 and the upper portion of the amorphous cover semiconductor material layer 601 (if present) into the polycrystalline semiconductor channel material layer 60P can occur during the solid phase epitaxial growth that forms the epitaxial pedestal structure 311 or during a subsequent anneal process that is performed at a higher temperature than the anneal temperature of the solid phase epitaxial growth process. The entirety of the polycrystalline semiconductor channel material layer 60P includes a polycrystalline semiconductor material, such as polysilicon.

In one embodiment, the epitaxial pedestal structure 311 can include a cylindrical portion 11C having a cylindrical shape and a protrusion portion 11P that protrudes above a horizontal plane including the bottommost surface of the memory film 50. The cylindrical portion 11C refers to the portion of the epitaxial pedestal structure 311 located below the horizontal plane including the bottommost surface of the memory film 50. The cylindrical portion 11 can have a circular or elliptical bottom surface, a cylindrical sidewall, and an annular top surface. The protrusion portion 11P includes a first tubular portion that extends through an opening in the memory film 50, and a second tubular portion that extends above the opening in the memory film 50 and contacts an inner tubular sidewall of a vertically-extending portion of the memory film 50.

In one embodiment, an upper region of the cylindrical portion 11C of the epitaxial pedestal structure 311 comprises dopant atoms that do not introduce a conductivity type to the epitaxial pedestal structure 311 (e.g., dopants selected from germanium carbon or argon) that are introduced at the processing steps of FIG. 5D, and a lower region of the cylindrical portion 11C of the epitaxial pedestal structure 311 can be free of the dopant. The polycrystalline semiconductor channel material layer 60P and a region of the protrusion portion 11P that overlies an annular bottom portion of the memory film 50 can be free of the dopant.

Referring to FIG. 5L, the steps described above with respect to FIGS. 5I and 5J are performed to form the vertical semiconductor channel 60, the drain region 63 and the dielectric core 62 in the structure of FIG. 5K.

FIGS. 6A-6H are sequential schematic vertical cross-sectional views of a memory opening during formation of a third exemplary memory opening fill structure therein according to a third embodiment of the present disclosure.

Referring to FIG. 6A, the third embodiment of the exemplary structure of the present disclosure can be derived from the first exemplary structure of the first embodiment after the processing steps of FIG. 5B by reducing the height of the epitaxial pedestal structure 11. Specifically, the height of the epitaxial pedestal structure 11 is reduced during growth such that the top surface of the epitaxial pedestal structure 11 is formed at a height at which an interface between the epitaxial pedestal structure 11 and a vertical semiconductor channel 60 is to be subsequently formed. For example, a top surface of the epitaxial pedestal structure 11 can contact a sidewall of a bottommost one of the sacrificial material layers 42. The height of the epitaxial pedestal structure 11 can be in a range from 20 nm to 150 nm, although lesser and greater heights can also be employed.

Referring to FIG. 6B, a selective semiconductor deposition process can be performed to grow a semiconductor material from a physically exposed semiconductor surface at a bottom of the memory opening 49 without growing the semiconductor material from physically exposed surfaces of the insulating layers 32 and the spacer material layers (such as the sacrificial material layers 42) of the alternating stack. Specifically, the physically exposed semiconductor surface at the bottom of the memory opening 49 can include the top surface of the epitaxial pedestal structure 11.

In one embodiment, the selective semiconductor deposition process comprises a chemical vapor deposition process in which a semiconductor precursor gas and an etchant gas is concurrently or alternately flowed into a process chamber including the substrate 9 and the alternating stack (32, 42) thereupon. For example, the semiconductor precursor gas for depositing silicon can include silane ($SiH_4$) disilane ($SiH_2Cl_2$), trichlorosilicate ($SiHCl_3$), silicon tetrachloride ($SiCl_4$), or other semiconductor precursor gases known in the art. The etchant gas can include, for example, hydrogen chloride. The deposition temperature can be selected to be a temperature below a crystallization temperature. For example, if the selective semiconductor deposition process deposits amorphous silicon, the deposition temperature of the selective semiconductor deposition process can be less than 570 degrees Celsius.

An amorphous semiconductor material portion 211 is formed directly on a top surface of the epitaxial channel structure 11. The amorphous semiconductor material portion 211 may include dopants of the first conductivity type. In this case, the atomic concentration of the dopants of the first conductivity type in the amorphous semiconductor material portion 211 can be in a range from $1.0 \times 10^{14}/cm^3$ to $3.0 \times 10^{17}/cm^3$, although lesser and greater atomic concentrations can also be employed. The thickness of the amorphous semiconductor material portion 211 can be in a range from 10 nm to 80 nm, such as from 20 nm to 40 nm, although lesser and greater thicknesses can also be employed. The amorphous semiconductor material portion 211 can be formed directly on the upper portion of, the epitaxial pedestal structure 11.

Figure 6C:
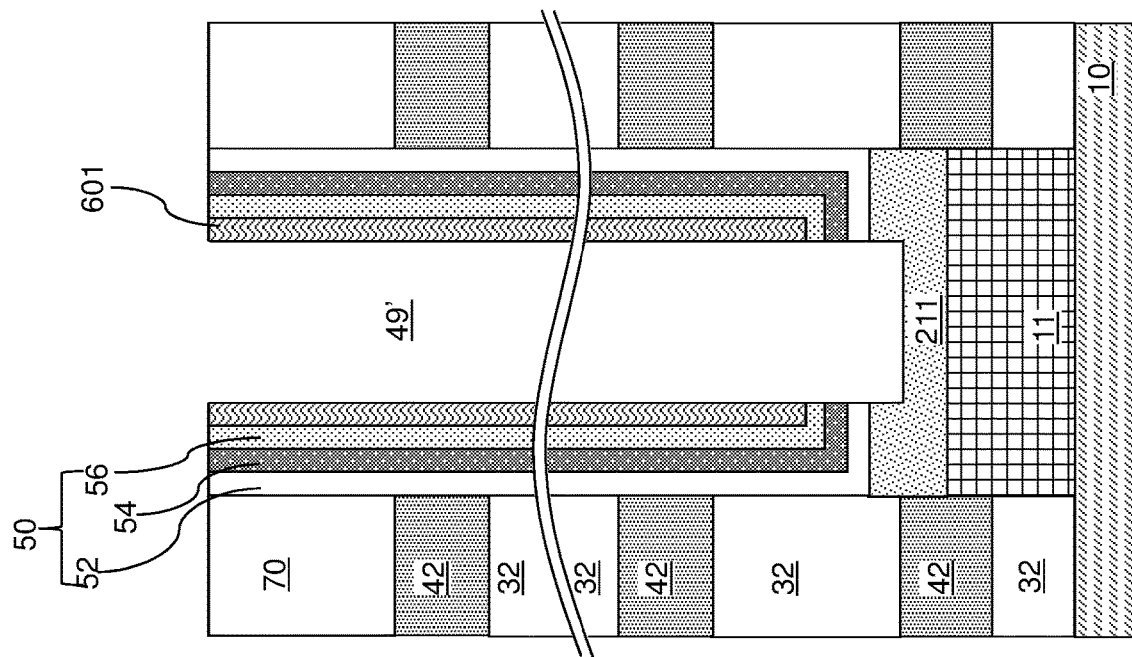

Referring to FIG. 6C, the processing steps of FIG. 5C and the processing steps of FIG. 5E can be performed to form a blocking dielectric layer 52, a charge storage layer 54, a tunneling dielectric layer 56, and an amorphous cover semiconductor material layer 601. Each of the blocking dielectric layer 52, the charge storage layer 54, the tunneling dielectric layer 56, and the amorphous cover semiconductor material layer 601 can have the same material composition and the same thickness as in the first exemplary memory opening fill structure.

Figure 6D:
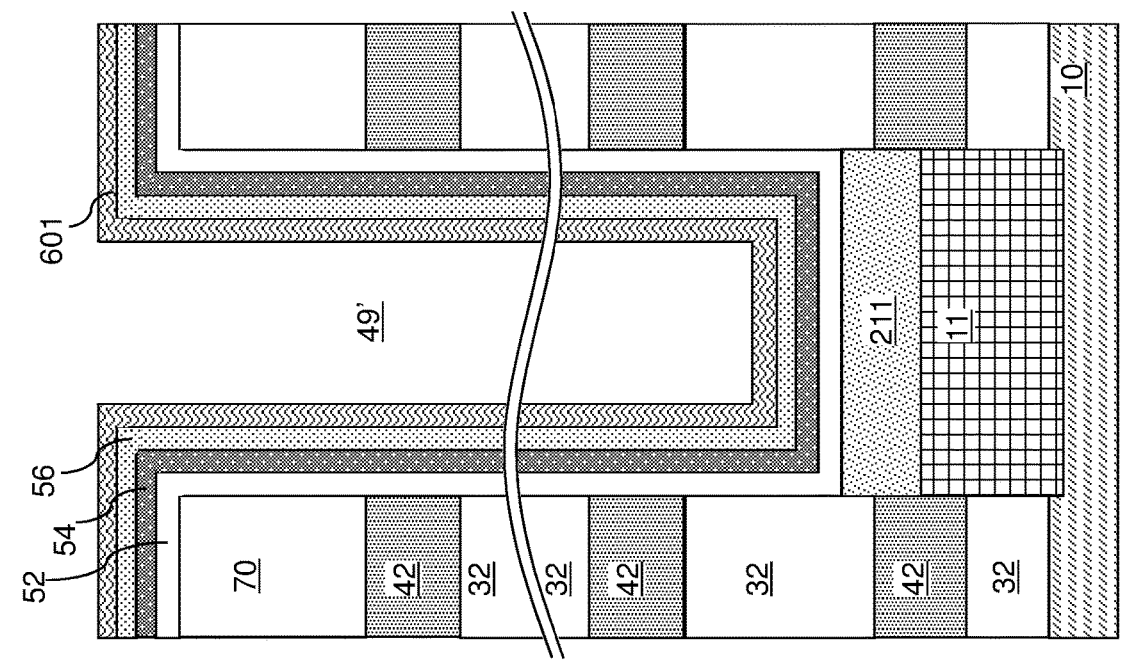

Referring to FIG. 6D, the processing steps of FIG. 5F can be performed to anisotropic etch the amorphous cover semiconductor material layer 601, the tunneling dielectric layer 56, the charge storage layer 54, and the blocking dielectric layer 52. The portions of the amorphous cover semiconductor material layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the amorphous cover semiconductor material layer 601, the tunneling dielectric layer 56, the charge storage layer 54, and the blocking dielectric layer 52 at a bottom of each memory cavity 49' can be removed to form openings through remaining portions thereof. Each of the amorphous cover semiconductor material layer 601, the tunneling dielectric layer 56, the charge storage layer 54, and the blocking dielectric layer 52 can be etched by a respective anisotropic etch process employing a respective etch chemistry, which may, or may not, be the same for the various material layers. An exposed center portion of each amorphous semiconductor material portion 211 can be recessed to provide a recessed top surface and an inner cylindrical sidewall that adjoins the recessed top surface to an unrecessed annular surface of the respective amorphous semiconductor material portion 211.

Each remaining portion of the amorphous cover semiconductor material layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

Surfaces of the amorphous semiconductor material portion 211 can be physically exposed underneath the opening through the amorphous cover semiconductor material layer 601, the tunneling dielectric layer 56, the charge storage layer 54, and the blocking dielectric layer 52. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising regions of the charge storage layer 54) that are insulated from surrounding materials by the blocking dielectric layer 52 and the tunneling dielectric layer 56. In one embodiment, the amorphous cover semiconductor material layer 601, the tunneling dielectric layer 56, the charge storage layer 54, and the blocking dielectric layer 52 can have vertically coincident sidewalls.

A memory film 50 is formed in each memory opening 49. The memory film includes an opening at a bottom portion thereof. Each of the memory films 50 comprises a layer stack that includes a charge storage layer 54 containing a respective vertical stack of memory elements, and a tunneling dielectric layer 56 contacting an inner sidewall of the charge storage layer 54. The memory elements can be portions of the charge storage layer 54 located at the levels of the sacrificial material layers 42, which are subsequently replaced with electrically conductive layers. The cover semiconductor material layer 60I may be either removed or retained after this step.

Referring to FIG. 6E, the processing steps of FIG. 5G can be performed to deposit an amorphous semiconductor channel material layer 602 including an amorphous semiconductor channel material. The amorphous semiconductor channel material layer 602 can be conformally and non-selectively deposited directly on the semiconductor surface of the amorphous semiconductor material portion 211, and directly on the memory films 50 (if the cover semiconductor material layer 601 is removed). The material of the amorphous semiconductor material portion 211 and the amorphous semiconductor channel material layer 602 constitute a semiconductor channel material. The amorphous semiconductor channel material layer 602 includes an amorphous semiconductor material such as at least one elemental semiconductor material, at least one III-V compound semiconductor material, at least one II-VI compound semiconductor material, at least one organic semiconductor material, or other semiconductor materials known in the art. In one embodiment, the amorphous semiconductor channel material layer 602 includes amorphous silicon. The amorphous semiconductor channel material layer 602 can be formed by a conformal deposition method such as low pressure chemical vapor deposition (LPCVD). For example, if low pressure chemical vapor deposition process employing silane as a precursor gas is employed to deposit amorphous silicon by thermal decomposition of silane, deposition temperature less than 570 degrees Celsius can be employed to deposit amorphous silicon. The amorphous semiconductor channel material layer 602 may partially fill the memory cavity 49' in each memory opening 49, or may fully fill the cavity in each memory opening 49. The amorphous semiconductor channel material layer 602 can have a doping of the first conductivity type. The atomic concentration of dopants of the first conductivity type in the amorphous semiconductor channel material layer 602 can be in a range from $1.0 \times 10^{14}/cm^3$ to $3.0 \times 10^{17}/cm^3$, although lesser and greater atomic concentrations can also be employed. The thickness of the amorphous semiconductor channel material layer 602 can be in range from 2 nm to 40 nm, such as from 4 nm to 20 nm, although lesser and greater thicknesses can also be employed.

Referring to FIG. 6F, an anneal process can be performed to covert the amorphous semiconductor channel material in the amorphous semiconductor material portion 211 and the amorphous semiconductor channel material layer 602 into polycrystalline semiconductor material portions. A rapid thermal anneal (RTA) process can be employed to convert the amorphous semiconductor channel material in the amorphous semiconductor material portion 211 and the amorphous semiconductor channel material layer 602 into the polycrystalline semiconductor material portions. The peak temperature of the RTA process can be in a range from 950 degrees Celsius to 1050 degrees Celsius, and the duration of the peak temperature can be in a range from 0.1 second to 10 seconds. Alternatively, a furnace anneal may be employed to convert the amorphous semiconductor channel material in the amorphous semiconductor material portion 211 and the amorphous semiconductor channel material layer 602 into the polycrystalline semiconductor material portions. The polycrystalline semiconductor material portions constitute a polycrystalline semiconductor channel material layer 60P, such as polysilicon.

Referring to FIG. 6G, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 6H, portions of the dielectric core layer 62L can be removed, for example, by a recess etch that etches the material of the dielectric core layer 62L selective to the material of the polycrystalline semiconductor channel material layer 60P. An isotropic etch process such as a wet etch process or an anisotropic etch process such as a reactive ion etch process may be employed. The dielectric material of the dielectric core layer 62L can be recessed such that the top surface of each remaining portion of the dielectric core layer 62L is formed between the horizontal plane including the top surface of the insulating cap layer 70 and the horizontal plane including the bottom surface of the insulating cap layer 70. Each remaining portion of the dielectric core layer 62L constitutes a dielectric core 62.

Further, the horizontal portion of the polycrystalline semiconductor channel material layer 60P located above the top surface of the insulating cap layer 70 can be removed by an anisotropic etch process such as a reactive ion etch process. Each discrete remaining portion of the polycrystalline semiconductor channel material layer 60P constitutes a vertical semiconductor channel 60, which can consist of a polycrystalline semiconductor material. Each vertical semiconductor channel 60 is formed on an inner sidewall of a respective memory film 50. Each vertical semiconductor channel 60 can be located entirety within a memory opening 49 or entirely within a support opening 19

Thus, the vertical semiconductor channels 60 are formed by annealing and patterning the amorphous semiconductor material portion 211, the amorphous cover semiconductor material layer 601 (if present), and the amorphous semiconductor channel material layer 602. Each vertical semiconductor channel 60 comprises a polycrystalline cylindrical portion 60C contacting an inner sidewall of a vertically-extending portion of the memory film 50, a polycrystalline neck portion 60N extending through the opening in the memory film 50, and a polycrystalline base portion 60B contacting an annular bottom surface of the memory film 50.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. The entirety of each drain region 63 can be polycrystalline. Each drain region 63 is formed at upper end of a respective vertical semiconductor channel 60.

A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of an epitaxial pedestal structure 11, a memory stack structure 55, a dielectric core 62, and a drain region 63 within a memory opening 49 is herein referred to as a memory opening fill structure 58. Each combination of an epitaxial pedestal structure 11, a memory stack structure 55, a dielectric core 62, and a drain region 63 within each support opening 19 fills the respective support openings 19, and constitutes a support pillar structure.

Generally, each of the memory opening fill structures 58 comprises: a memory film 50 contacting a sidewall of a respective memory opening 49, comprising a vertical stack of memory elements (comprising portions of the charge storage layer 54) therein, and including an opening at a bottom portion thereof; and a vertical semiconductor channel 60 including a polycrystalline cylindrical portion 60C contacting an inner sidewall of a vertically-extending portion of the memory film 50, a polycrystalline neck portion 60N extending through an opening in an annular bottom portion of the memory film 50, and a polycrystalline base portion 60B contacting an annular bottom surface of the annular bottom portion of the memory film 50.

In one embodiment, an outer bottom periphery of the memory film coincides with an outer top periphery of the polycrystalline base portion of the vertical semiconductor channel. In one embodiment, the polycrystalline base portion 60B of the vertical semiconductor channel 60 contacts one of the insulating layers 32 of the alternating stack (32, 42). In one embodiment, the polycrystalline cylindrical portion 60C has a greater lateral thickness (i.e., width) than the polycrystalline neck portion 60N.

In one embodiment, an inner cylindrical sidewall of the polycrystalline cylindrical portion 60C is vertically coincident with an inner cylindrical sidewall of the polycrystalline neck portion 60B. An outer cylindrical sidewall of the polycrystalline cylindrical portion 60C can be laterally offset outward from an outer cylindrical sidewall of the polycrystalline neck portion 60N.

In one embodiment, each of the memory opening fill structures 58 comprises an epitaxial pedestal structure 11 including a single crystalline semiconductor material and contacting the polycrystalline base portion 60B. In one embodiment, a top periphery of the epitaxial pedestal structure 11 can be coincident with a bottom periphery of the polycrystalline base portion 60B of the vertical semiconductor channel 60.

In one embodiment, each of the memory opening fill structures 58 comprises a dielectric core 62 contacting an inner sidewall of the polycrystalline cylindrical portion 60C, an inner sidewall of the polycrystalline neck portion 60N extending, and a top surface of the polycrystalline base portion 60B. In one embodiment, each of the memory films 50 comprises a layer stack that includes: a charge storage layer 54 containing a respective vertical stack of memory elements, and a tunneling dielectric layer 56 contacting an inner sidewall of the charge storage layer 54. In one embodiment, the tunneling dielectric layer 56 contacts an outer sidewall of a respective polycrystalline cylindrical portion 60C and an upper portion of an outer sidewall of a respective polycrystalline neck portion 60N, and does not contact the polycrystalline base portion 60B. In one embodiment, each of the memory opening fill structures 58 comprises a drain region 63 contacting a top end of a respective vertical semiconductor channel 60.

Figure 6J:
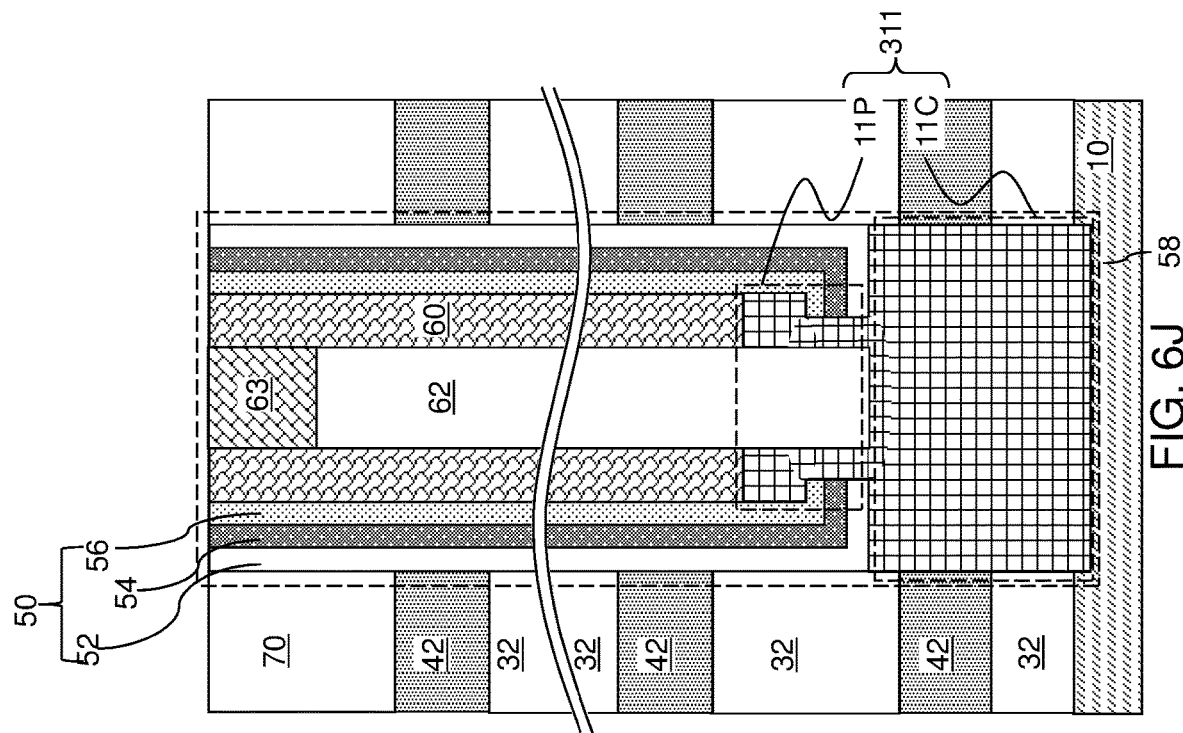
FIGS. 6I-6J are sequential schematic vertical cross-sectional views of a memory opening during formation of a fourth exemplary memory opening fill structure therein according to a fourth embodiment of the present disclosure.
Figure 6I:
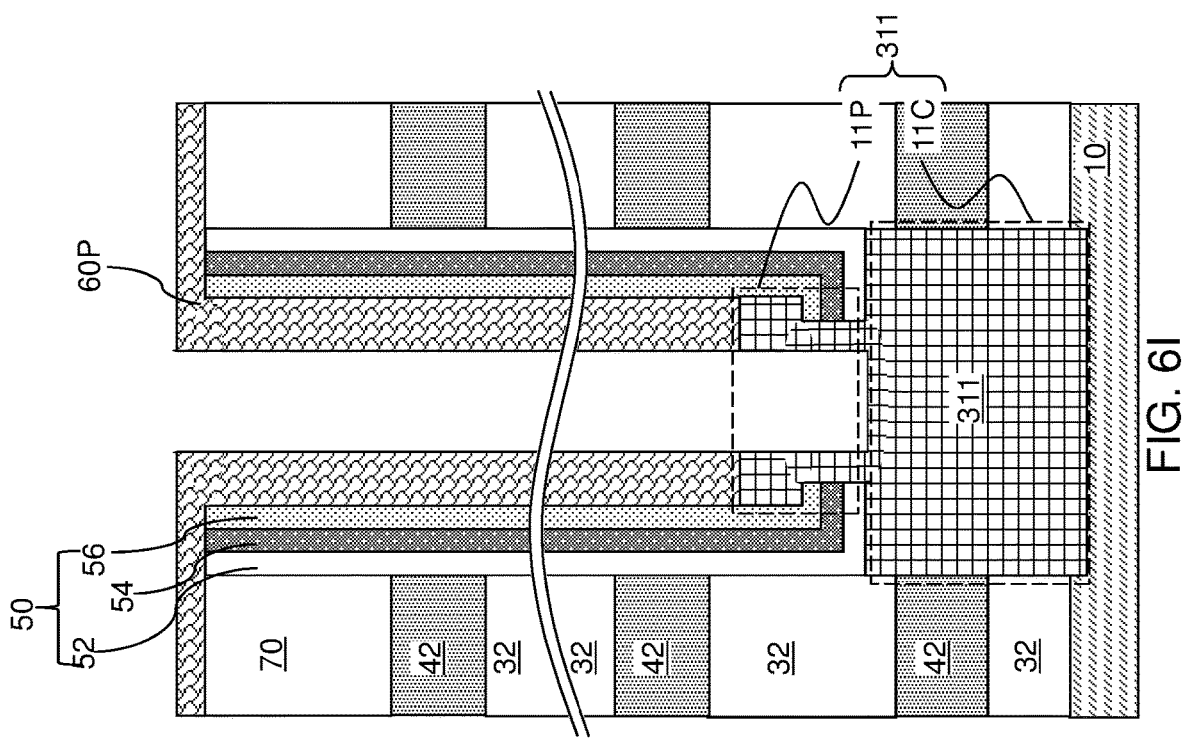

FIGS. 6I-6J are sequential schematic vertical cross-sectional views of a memory opening during formation of a fourth exemplary memory opening fill structure therein according to a fourth embodiment of the present disclosure.

Referring to FIG. 6I, the fourth embodiment of the exemplary structure of the present disclosure can be derived from the third exemplary structure of the third embodiment after the processing steps of FIG. 6E. Instead of the crystallization anneal which forms the polycrystalline semiconductor channel material layer 60P, a solid phase crystallization anneal may be performed instead to extend the single crystalline semiconductor material of the epitaxial pedestal portion into the semiconductor channel material layer 60₂. This forms structure containing the epitaxial pedestal portion 311 containing portions 11P and 11C, as described above with respect to FIG. 5K.

Referring to FIG. 6J, the step described above with respect to FIGS. 6G and 6H are performed to form the vertical semiconductor channel 60, the drain region 63 and the dielectric core 62 of the structure of FIG. 6H.

Figure 7:
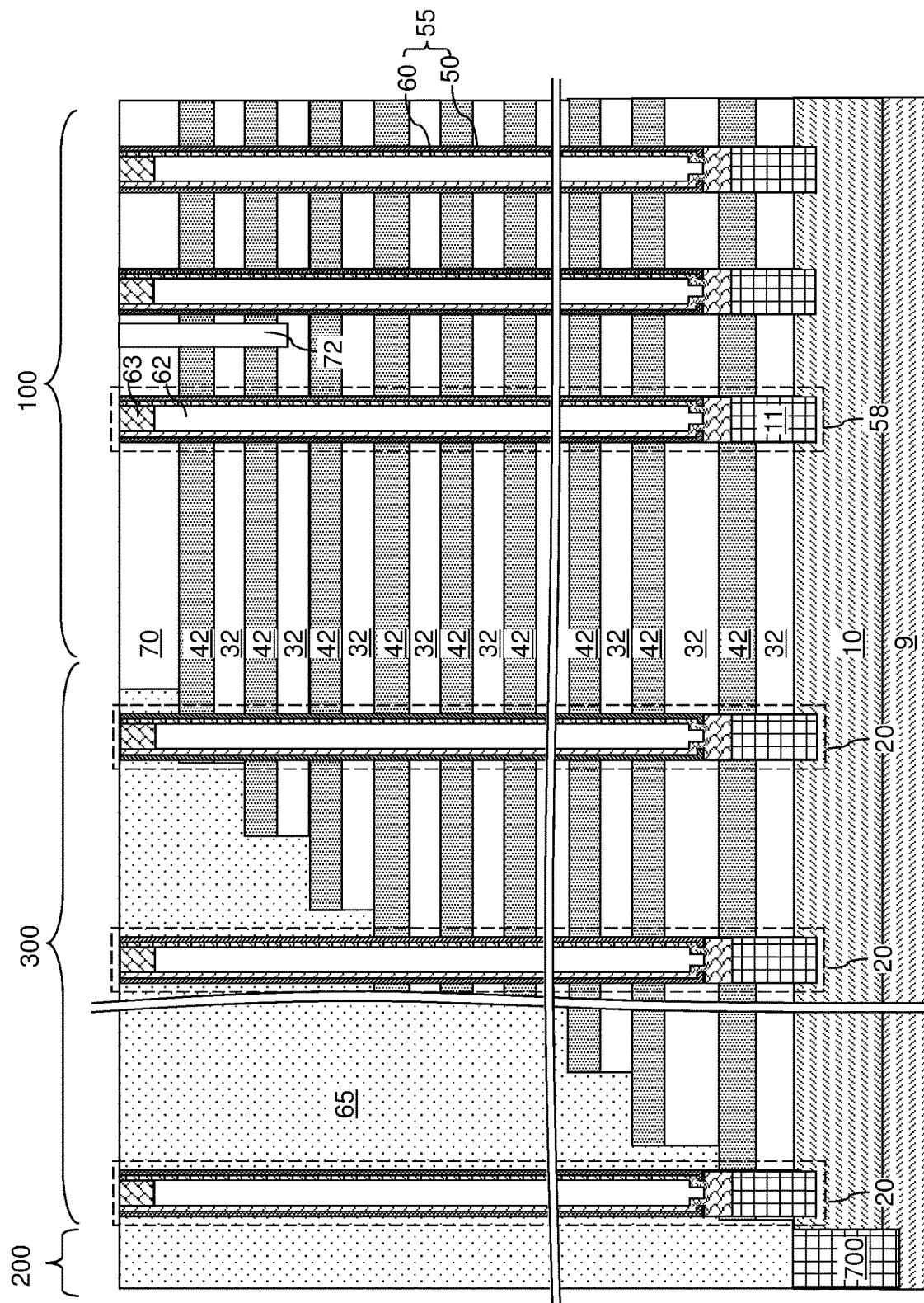
FIG. 7 is a schematic vertical cross-sectional view of the first and third exemplary structures after formation of memory stack structures and support pillar structures according to first and third embodiments of the present disclosure.

Referring to FIG. 7, the exemplary structure is illustrated after the processing steps of FIG. 5J or after the processing steps of FIG. 6H, i.e., after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60, a vertical stack of charge storage regions (comprising portions of the charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 8A:
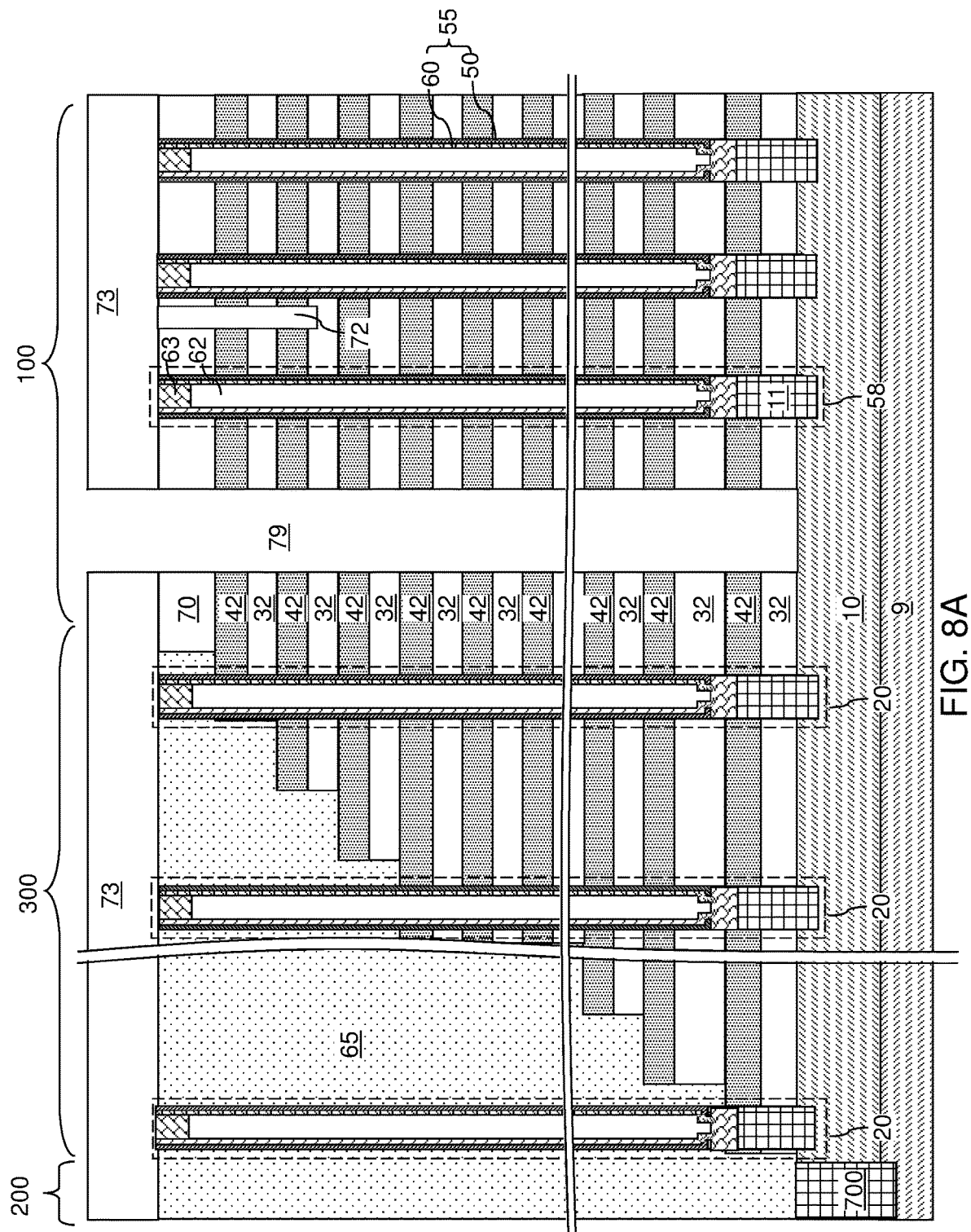
FIG. 8A is a schematic vertical cross-sectional view of the first and third exemplary structures after formation of backside trenches according to first and third embodiments of the present disclosure.
Figure 8B:
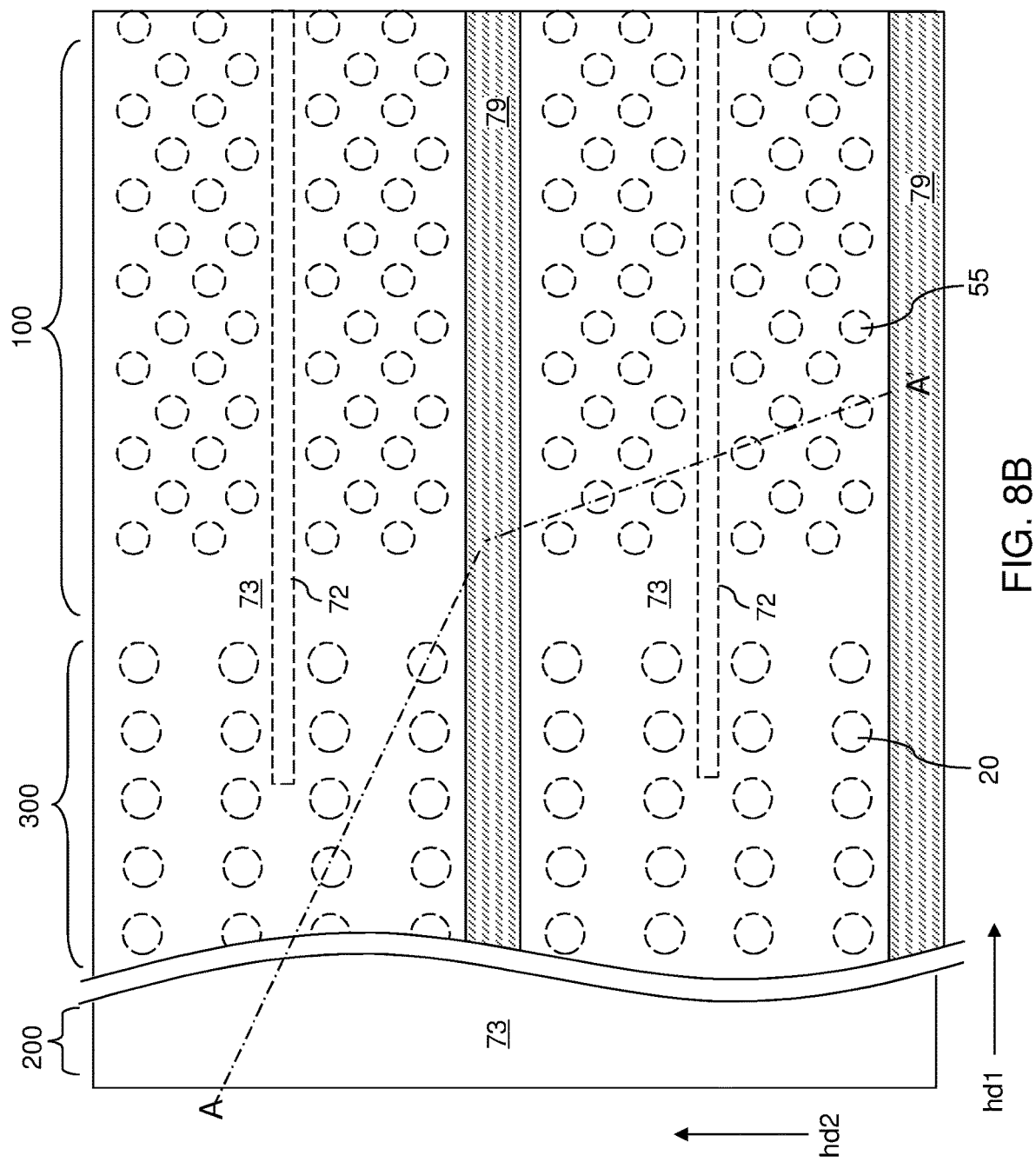
FIG. 8B is a partial see-through top-down view of the first and third exemplary structures of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 9:
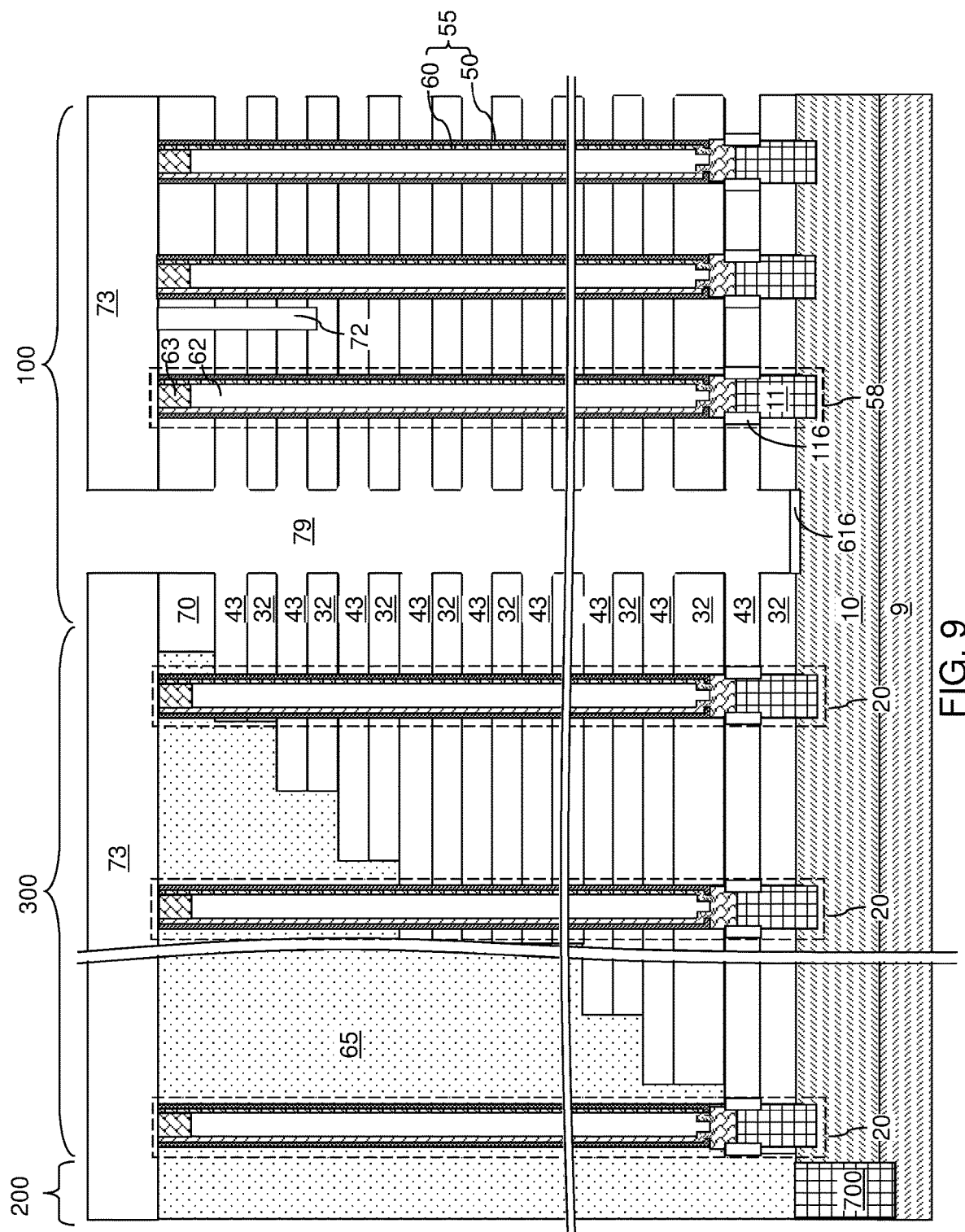
FIG. 9 is a schematic vertical cross-sectional view of the first and third exemplary structure after formation of backside recesses according to first and third embodiments of the present disclosure.

Referring to FIGS. 9 and 10A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the epitaxial pedestal structures 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial pedestal structure 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus.

In one embodiment, each tubular dielectric spacer 116 can include a lower dielectric material portion and an upper dielectric material portion. The lower dielectric material portion can include the same semiconductor element as the epitaxial pedestal structures 11 and additionally includes at least one non-metallic element such as oxygen and/or nitrogen such that the material of the tubular dielectric spacers 116 is a dielectric material. The upper dielectric material portion can include the same semiconductor element as the polycrystalline base portion 60B and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial pedestal structures 11. Each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 11:
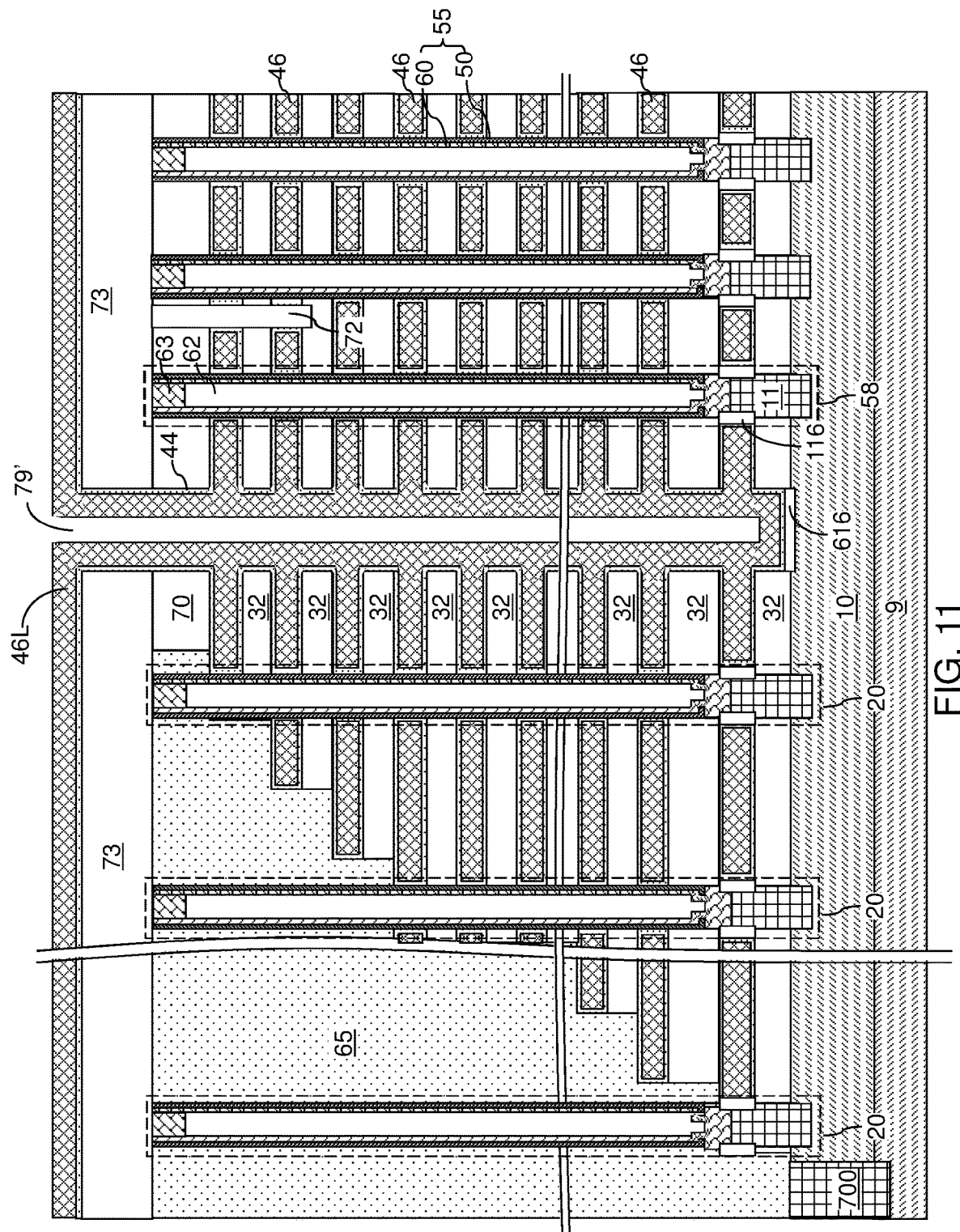
FIG. 11 is a schematic vertical cross-sectional view of the first and third exemplary structures at the processing step of FIG. 10D.

Referring to FIGS. 10D and 11, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a epitaxial pedestal structure 11. A bottommost electrically conductive layer 46 laterally surrounds each tubular dielectric spacer 116 upon formation of the electrically conductive layers 46.

Figure 12A:
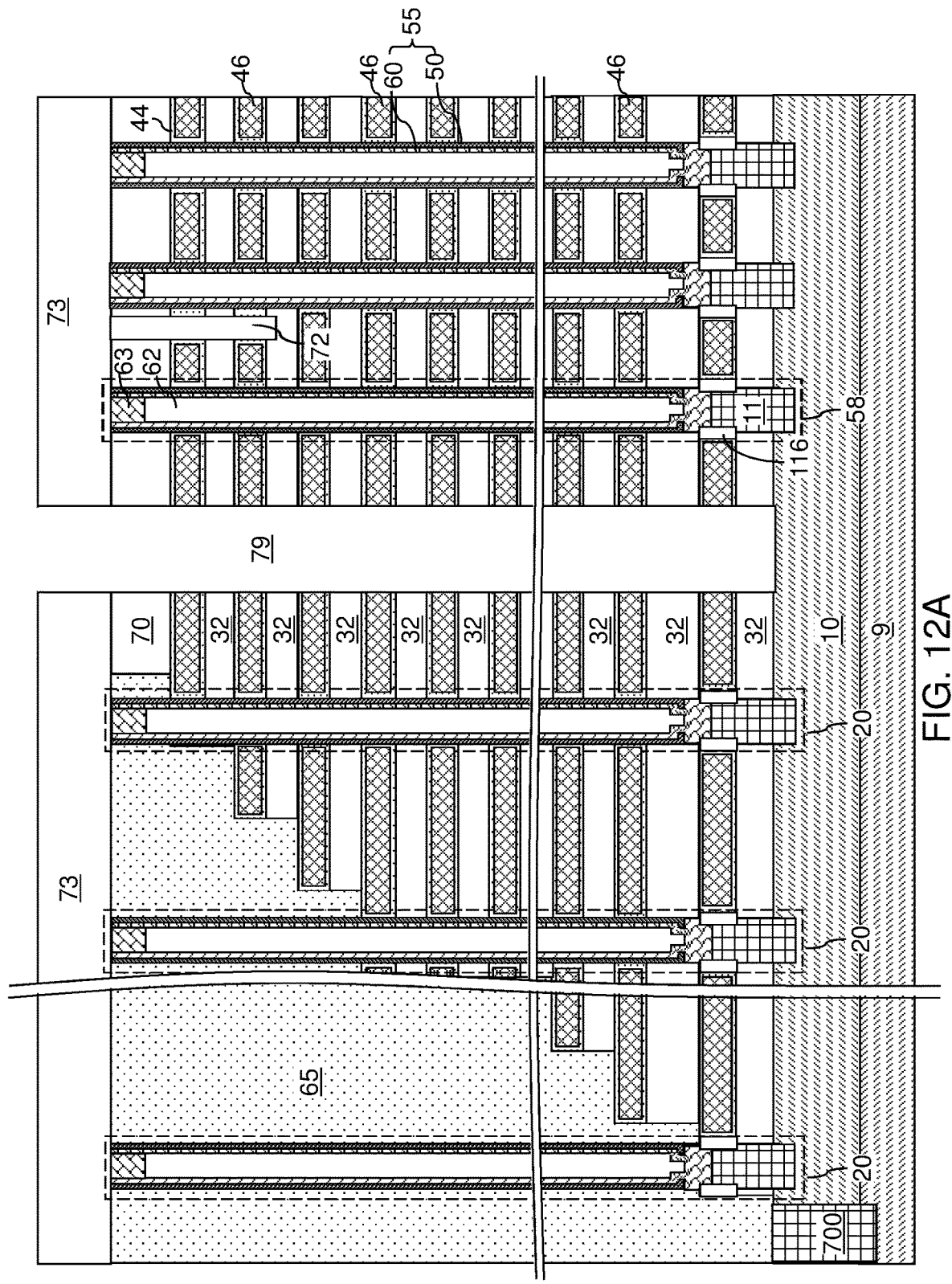
FIG. 12A is a schematic vertical cross-sectional view of the first and third exemplary structures after removal of a deposited conductive material from within the backside trench according to first and third embodiments of the present disclosure.
Figure 12B:
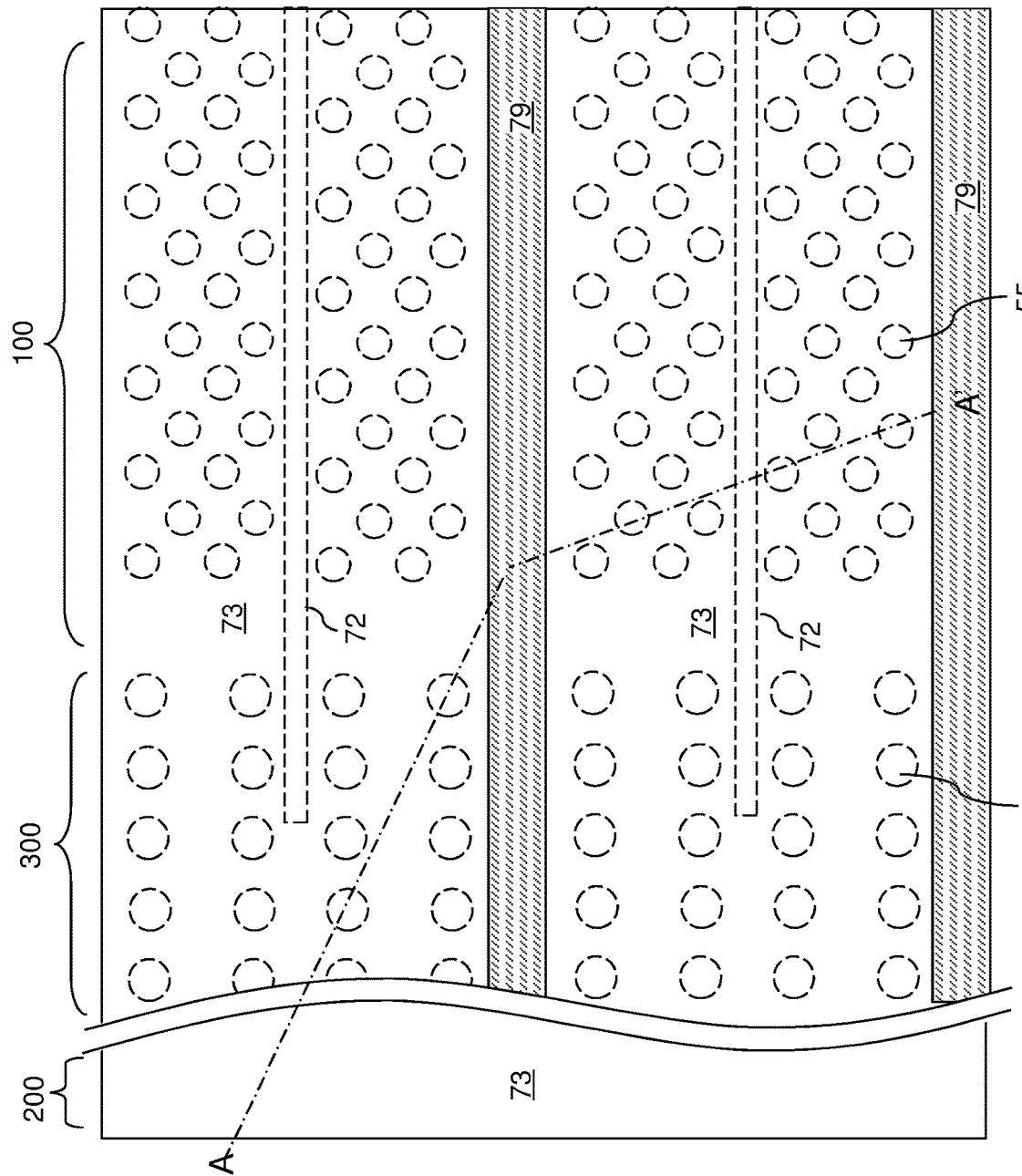
FIG. 12B is a partial see-through top-down view of the exemplary structure of FIG. 12A. The vertical plane A-A' is the plane of the schematic vertical cross-sectional view of FIG. 12A.

Referring to FIG. 12, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. In one embodiment, each vertically neighboring pair of an insulating layer 32 and an electrically conductive layer 46 can be spaced from each other by a backside blocking dielectric layer 44 that contacts outer sidewalls of the memory opening fill structures 58.

Figure 13A:
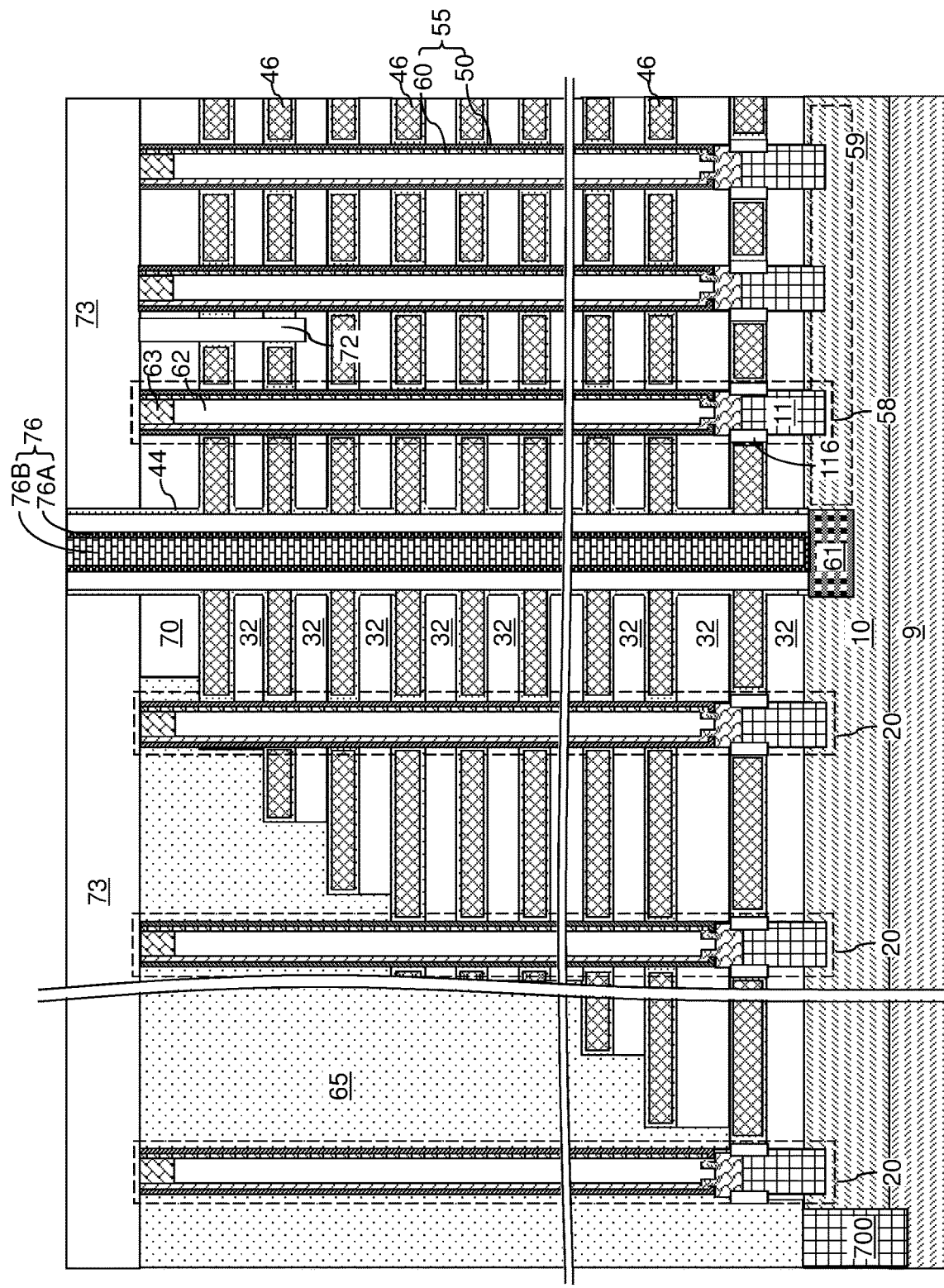
FIG. 13A is a schematic vertical cross-sectional view of the first and third exemplary structures after formation of an insulating spacer and a backside contact structure according to first and third embodiments of the present disclosure.
Figure 13B:
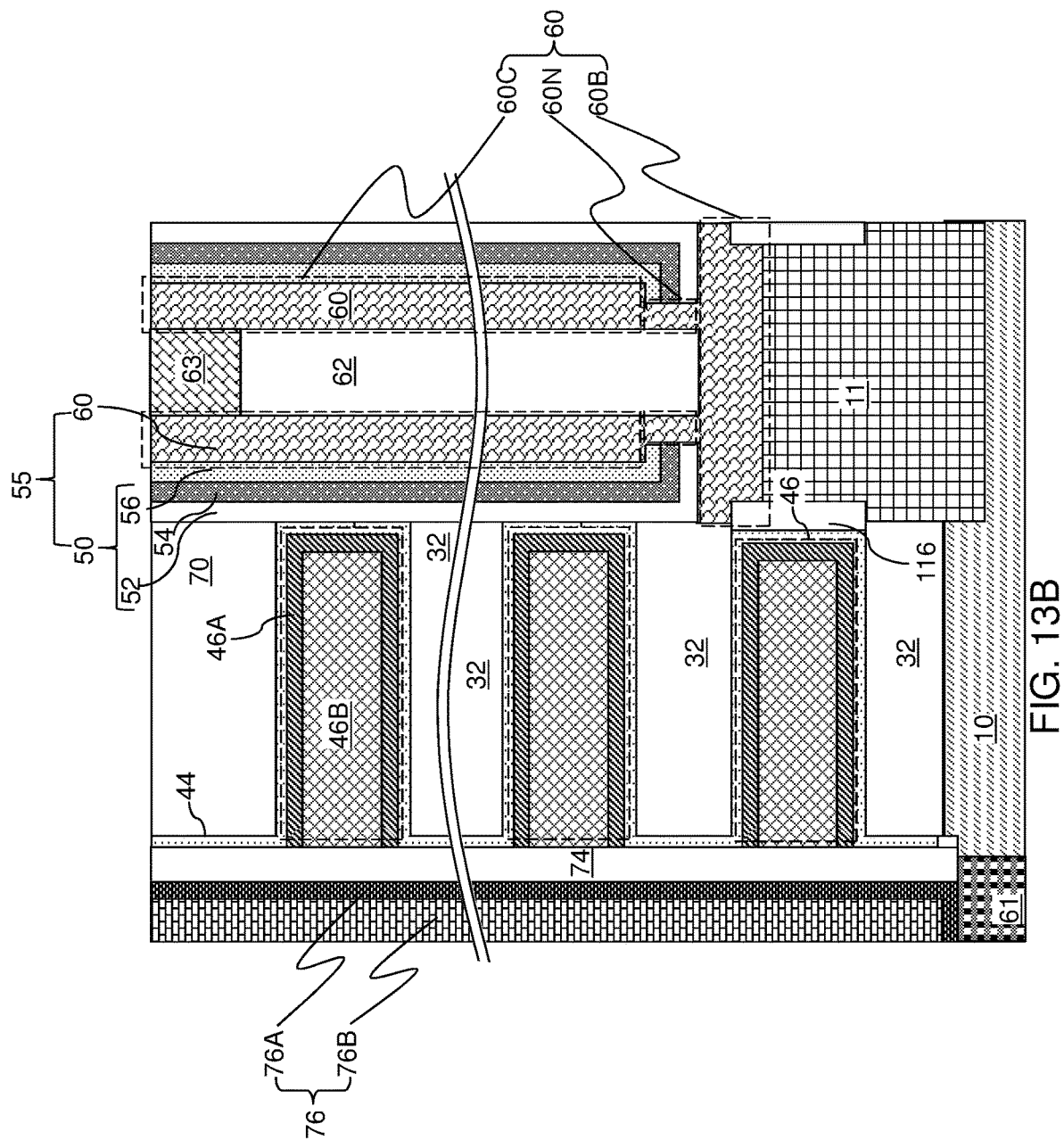
FIG. 13B is a magnified view of a region of the exemplary structure of FIG. 13A.

Referring to FIGS. 13A and 13B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial pedestal structures 11 constitutes a horizontal semiconductor channel 59 for a plurality of field effect transistors. The horizontal semiconductor channel 59 is connected to multiple vertical semiconductor channels 60 through respective epitaxial pedestal structures 11. The horizontal semiconductor channel 59 contacts the source region 61 and the plurality of epitaxial pedestal structures 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13C:
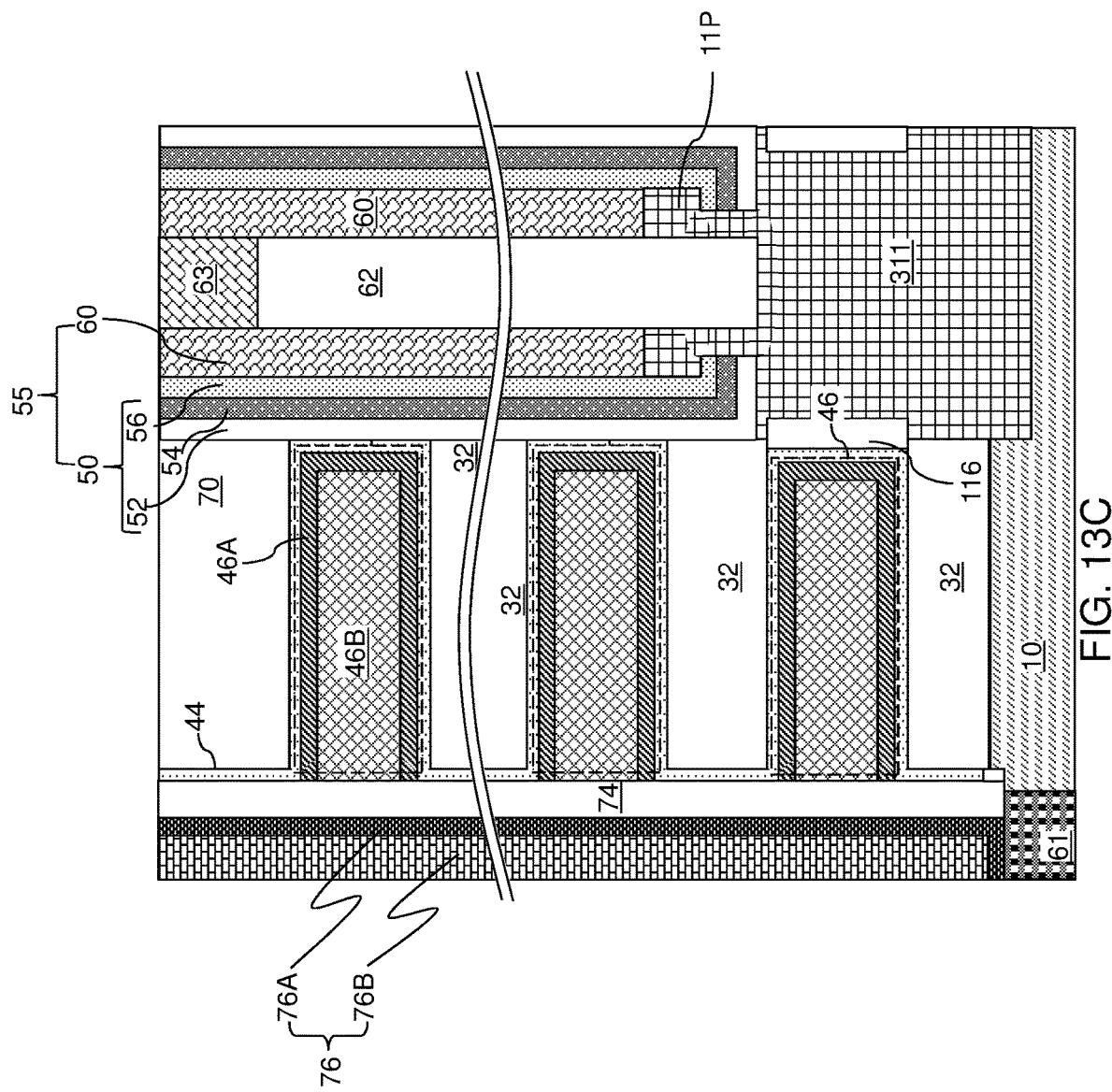
FIG. 13C is a magnified view of a region of the second and fourth exemplary structures at the step of FIG. 13A.

FIGS. 13A and 13B illustrate the structure of the first and third embodiments which include the epitaxial pedestal portion 11 shown in FIG. 5J or 6H. FIG. 13C illustrates the structure of the second and fourth embodiments which include the epitaxial pedestal portion 311 shown in FIG. 5L or 6J instead of the epitaxial semiconductor portion 11 at the same processing step as the structure of FIG. 13B of the first and third embodiments.

Figure 14A:
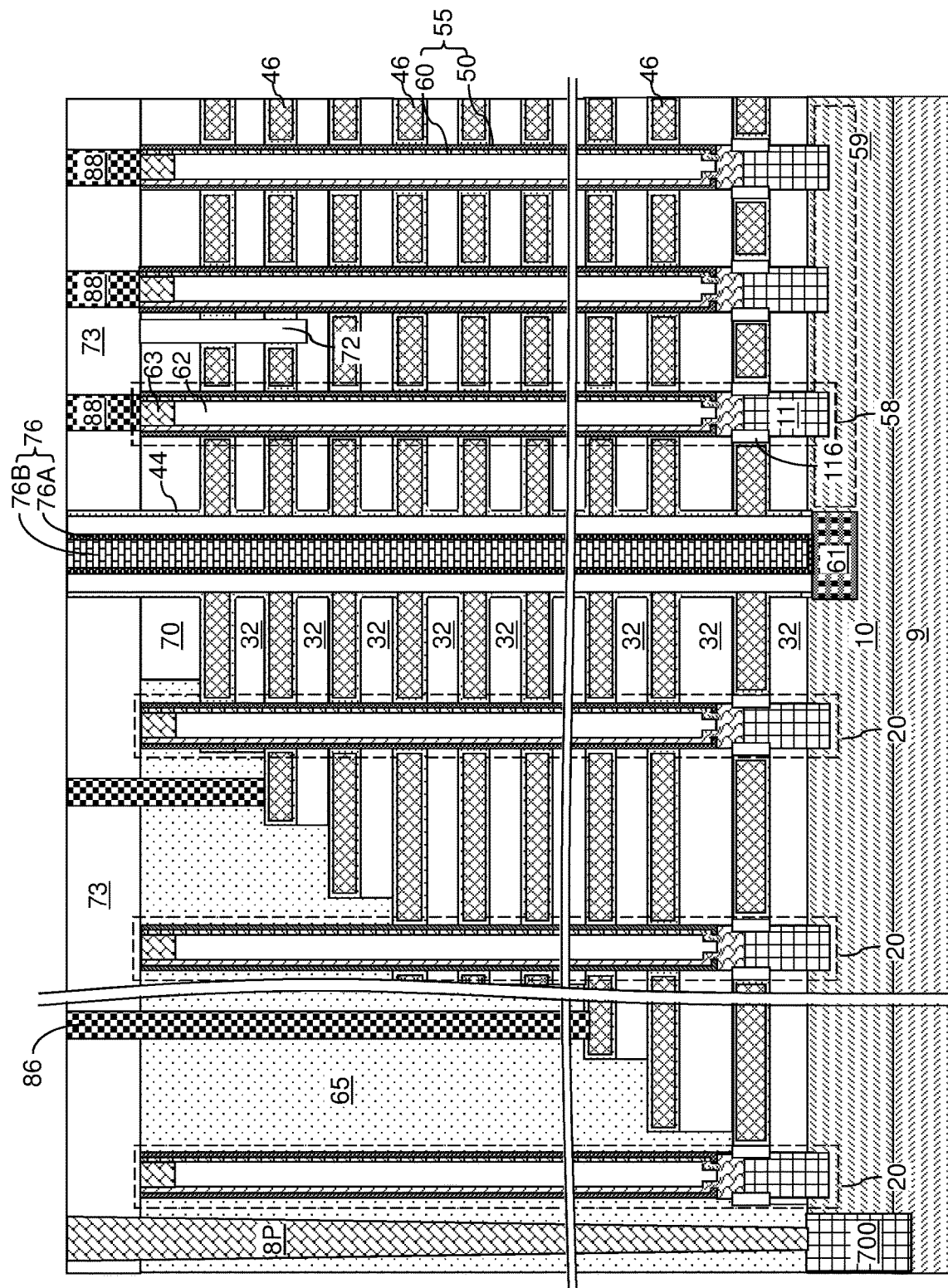
FIG. 14A is a schematic vertical cross-sectional view of the first and third exemplary structures after formation of additional contact via structures according to first and third embodiments of the present disclosure.
Figure 14B:
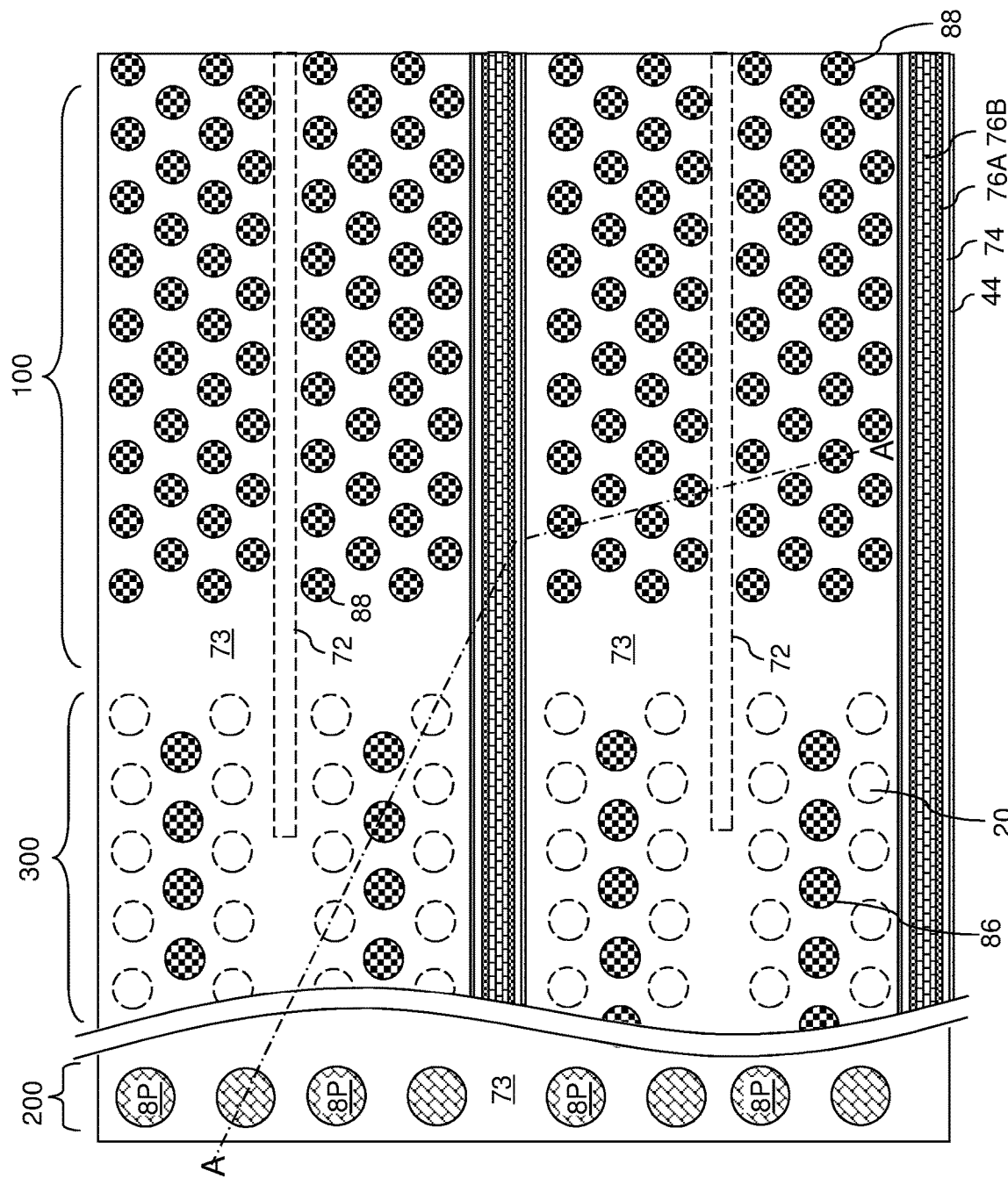
FIG. 14B is a top-down view of the exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Bit lines (not shown) are formed above and in electrical contact with the drain contact via structures 88. Layer contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 14C:
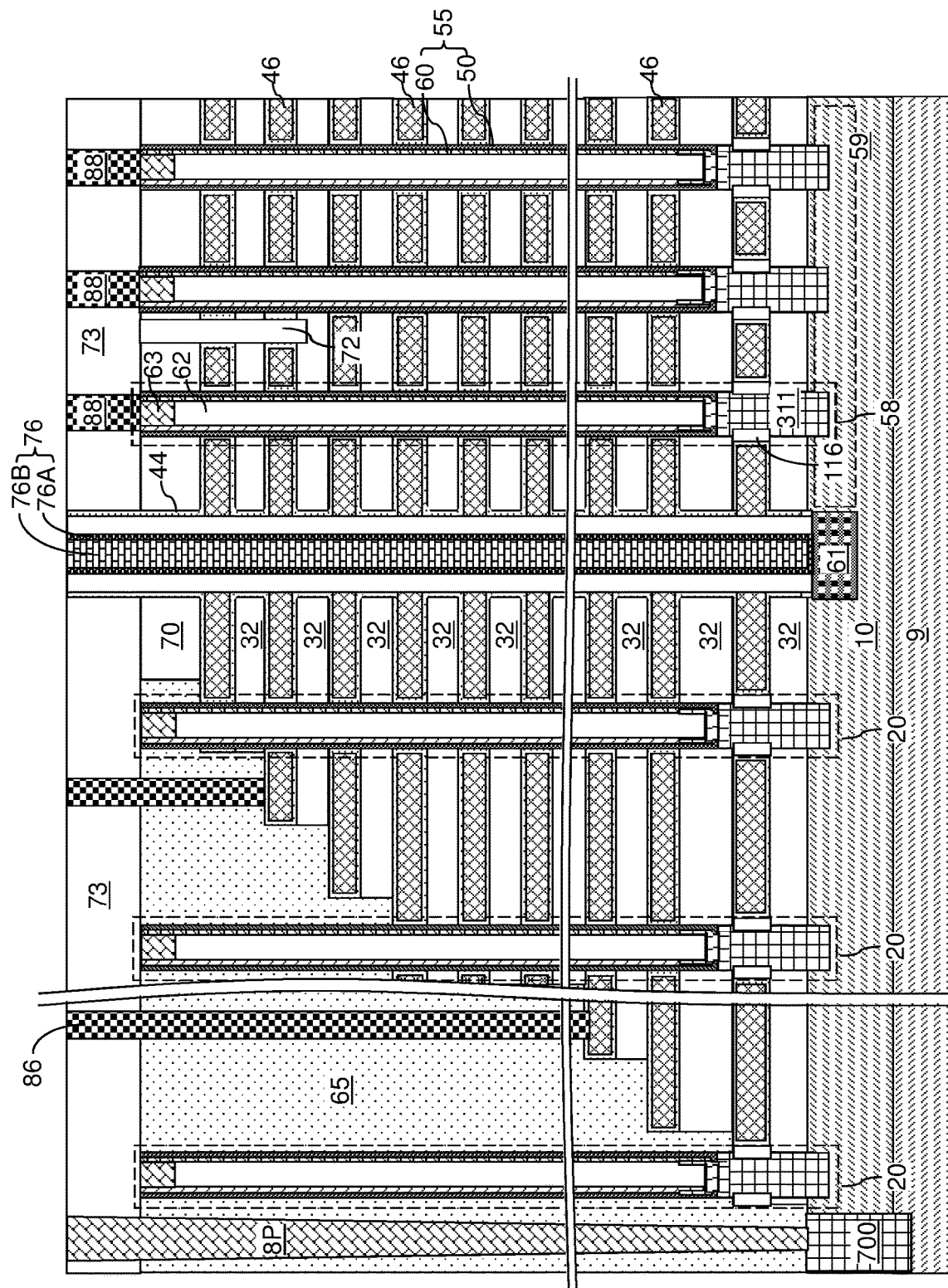
FIG. 14C is a schematic vertical cross-sectional view of the second and fourth exemplary structures after formation of additional contact via structures according to second and fourth embodiments of the present disclosure.

FIGS. 14A and 14B illustrate the structure of the first and third embodiments which include the epitaxial pedestal portion 11 shown in FIG. 5J or 6H. FIG. 14C illustrates the structure of the second and fourth embodiments which include the epitaxial pedestal portion 311 shown in FIG. 5L or 6J at the same processing step as the structure of FIG. 14A. Thus, referring to FIGS. 7 to 14B, the same steps are performed for the devices of the second and fourth embodiments shown in FIG. 14C as for the devices of the first and third embodiments shown in FIG. 14A.

Referring to the first and third embodiments of the present disclosure, a three-dimensional memory device is provided, which comprises: an alternating stack of insulating layers 32 and electrically conductive layers 46 located over a substrate (9, 10); memory openings 49 vertically extending through the alternating stack (32, 46); and memory opening fill structures 58 located within a respective one of the memory openings 49, wherein each of the memory opening fill structures 58 comprises: a memory film 50 contacting a sidewall of a respective memory opening 49, and including an opening in an annular bottom portion thereof; and a vertical semiconductor channel 60 including a polycrystalline cylindrical portion 60C contacting an inner sidewall of a vertically-extending portion of the memory film 50, a polycrystalline neck portion 60N extending through the opening in the annular bottom portion of the memory film 50, and a polycrystalline base portion 60B contacting an annular bottom surface of the annular bottom portion of the memory film 50.

In one embodiment, an outer bottom periphery of the memory film 50 coincides with an outer top periphery of the polycrystalline base portion 60B of the vertical semiconductor channel 60. In one embodiment, the polycrystalline base portion 60B of the vertical semiconductor channel 60 contacts one of the insulating layers 32 of the alternating stack (32, 46).

In one embodiment, the polycrystalline cylindrical portion 60C has a greater lateral thickness than the polycrystalline neck portion 60N. An inner cylindrical sidewall of the polycrystalline cylindrical portion 60C is vertically coincident with an inner cylindrical sidewall of the polycrystalline neck portion 60N, and an outer cylindrical sidewall of the polycrystalline cylindrical portion 60C is laterally offset outward from an outer cylindrical sidewall of the polycrystalline neck portion 60N.

In one embodiment, each of the memory opening fill structures 58 comprises an epitaxial pedestal structure 11 including a single crystalline semiconductor material and contacting the polycrystalline base portion 60N. In one embodiment, a top periphery of the epitaxial pedestal structure 11 is coincident with a bottom periphery of the polycrystalline base portion 60P of the vertical semiconductor channel 60.

In one embodiment, the polycrystalline base portion 60P comprises a dopant element selected from germanium, carbon or argon and the vertical semiconductor channel 60 comprises polysilicon. In one embodiment, each of the memory opening fill structures 58 comprises a dielectric core 62 contacting an inner sidewall of the polycrystalline cylindrical portion 60C, an inner sidewall of the polycrystalline neck portion 60N extending, and a top surface of the polycrystalline base portion 60B.

In one embodiment, each of the memory films 50 comprises a layer stack that includes: a charge storage layer 54, and a tunneling dielectric layer 56 contacting an inner sidewall of the charge storage layer 54. In one embodiment, the tunneling dielectric layer 54 contacts an outer sidewall of a respective polycrystalline cylindrical portion 60C and an upper portion of an outer sidewall of a respective polycrystalline neck portion 60N, and does not contact the polycrystalline base portion 60B. In one embodiment, each of the memory opening fill structures 58 comprises a drain region 63 contacting a top end of a respective vertical semiconductor channel 60.

In one embodiment, the alternating stacks comprise stepped surfaces in a staircase region 200, wherein each electrically conductive layer 46 other than a topmost one of the electrically conductive layers 46 laterally extends farther than an overlying electrically conductive layer 46; layer contact via structures 86 contact a top surface of a respective one of the electrically conductive layers 46 in the staircase region 200; a retro-stepped dielectric material portion 65 overlies the stepped surfaces 200; and support pillar structures 20 extend through the retro-stepped dielectric material portion 65 and the stepped surfaces in the staircase region 200.

Referring to the second and fourth embodiments of the present disclosure, a three-dimensional memory device includes an alternating stack of insulating layers 32 and electrically conductive layers 46 located over a substrate (9,10); memory openings 49 vertically extending through the alternating stack; and memory opening fill structures 58 located within a respective one of the memory openings 49. Each of the memory opening fill structures 58 comprises a memory film 50 contacting a sidewall of a respective memory opening 49 and including an opening at a bottom portion thereof; an epitaxial pedestal structure 311 comprising a single crystalline semiconductor material and including a cylindrical portion 11C located underneath a bottom surface of the memory film and a protrusion portion 11P having a tubular configuration and extending through the opening in the memory film 50; and a vertical semiconductor channel 60 contacting an inner sidewall of the memory film 50 and overlying and contacting the protrusion portion 11P of the epitaxial pedestal structure 311.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 11, 60).

In the first and third embodiments, entire top surface of an epitaxial pedestal structure 11 contacts an entire bottom surface of a polycrystalline base portion 60B. Thus, the contact area between a vertical semiconductor channel 60 and the epitaxial pedestal structure 11 is increased due to presence of the polycrystalline base portion 60B compared to prior art structures that do not employ any polycrystalline base portion. The robust electrical contact provided by direct contact between the entire top surface of the top surface of an epitaxial pedestal structure 11 and the entire bottom surface of the polycrystalline base portion 60B increases the on-current of each NAND string and enhances the operability margin of the vertical field effect transistors within each NAND string.

In the second and fourth embodiments, the epitaxial pedestal structure 311 extends through an opening in the memory film 50 as a single crystalline structure. The protrusion portion 11P of the epitaxial pedestal structure 311 provides a high electrical conductivity connection through the opening in the memory film 50. The physical contact between the epitaxial pedestal structure 311 and the vertical semiconductor channel 60 is provided at an annular interface that overlies the horizontal portion of the memory film 50 that includes the opening. The robust electrical contact to the vertical semiconductor channel 60 provided by the protrusion portion 11P of the epitaxial pedestal structure 311 increases the on-current of each NAND string and enhances the operability margin of the vertical field effect transistors within each NAND string.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate;
   memory openings vertically extending through the alternating stack; and
   memory opening fill structures located within a respective one of the memory openings, wherein each of the memory opening fill structures comprises:
   a memory film contacting a sidewall of a respective memory opening and including an annular opening at a bottom portion thereof;
   a vertical semiconductor channel including a polycrystalline cylindrical portion contacting an inner sidewall of a vertically-extending portion of the memory film, a polycrystalline neck portion extending through the annular opening in the annular bottom portion of the memory film, and a polycrystalline base portion contacting an annular bottom surface of the annular bottom portion of the memory film; and
   an epitaxial pedestal structure including a single crystalline semiconductor material and contacting the polycrystalline base portion and contacting a sidewall of a bottommost insulating layer of the insulating layers,
   wherein an outer periphery of a topmost surface of the epitaxial pedestal structure is coincident with a bottom periphery of the polycrystalline base portion of the vertical semiconductor channel.

2. Three-dimensional memory device of claim 1, wherein an outer bottom periphery of the memory film coincides with an outer top periphery of the polycrystalline base portion of the vertical semiconductor channel.

3. The three-dimensional memory device of claim 1, wherein the polycrystalline base portion of the vertical semiconductor channel contacts one of the insulating layers of the alternating stack.

4. The three-dimensional memory device of claim 1, wherein the polycrystalline cylindrical portion has a greater lateral thickness than the polycrystalline neck portion.

5. The three-dimensional memory device of claim 1, wherein:
   an inner cylindrical sidewall of the polycrystalline cylindrical portion is vertically coincident with an inner cylindrical sidewall of the polycrystalline neck portion; and
   an outer cylindrical sidewall of the polycrystalline cylindrical portion is laterally offset outward from an outer cylindrical sidewall of the polycrystalline neck portion.

6. The three-dimensional memory device of claim 1, wherein:
   the vertical semiconductor channel comprises polysilicon;
   the polycrystalline base portion comprises a dopant element selected from germanium, carbon, or argon; and
   the polycrystalline cylindrical portion is free of the dopant.

7. The three-dimensional memory device of claim 1, wherein each of the memory opening fill structures comprises a dielectric core contacting an inner sidewall of the polycrystalline cylindrical portion, an inner sidewall of the polycrystalline neck portion, and a top surface of the polycrystalline base portion.

8. The three-dimensional memory device of claim 1, wherein each of the memory films comprises a layer stack that includes:
   a charge storage layer; and
   a tunneling dielectric layer contacting an inner sidewall of the charge storage layer.

9. The three-dimensional memory device of claim 8, wherein the tunneling dielectric layer contacts an outer sidewall of a respective polycrystalline cylindrical portion and an upper portion of an outer sidewall of a respective polycrystalline neck portion, and does not contact the polycrystalline base portion.

10. The three-dimensional memory device of claim 1, wherein each of the memory opening fill structures comprises a drain region contacting a top end of a respective vertical semiconductor channel.

11. The three-dimensional memory device of claim 1, further comprising a tubular dielectric spacer comprising a portion that is composed of a dielectric oxide of a semiconductor material of the epitaxial pedestal structure and laterally surrounding and contacting the epitaxial pedestal structure.

12. The three-dimensional memory device of claim 11, wherein the tubular dielectric spacer laterally surrounds and contacts the polycrystalline base portion of the vertical semiconductor channel.

13. The three-dimensional memory device of claim 12, wherein the tubular dielectric spacer comprises an additional portion composed of a dielectric oxide of the polycrystalline base portion.

14. The three-dimensional memory device of claim 11, wherein the tubular dielectric spacer is topologically homeomorphic to a torus.

15. The three-dimensional memory device of claim 11, wherein the tubular dielectric spacer is located above and is vertically spaced from a horizontal plane including a top surface of the substrate.

16. The three-dimensional memory device of claim 11, wherein the tubular dielectric spacer is located below and is vertically spaced from the annular bottom surface of the annular bottom portion of the memory film.

17. The three-dimensional memory device of claim 11, wherein the sidewall of the bottommost insulating that contacts the pedestal channel portion comprises a cylindrical interface.

18. The three-dimensional memory device of claim 17, wherein:
    a top end of the cylindrical interface is adjoined to the tubular dielectric spacer; and
    a bottom end of the cylindrical interface is adjoined to a top surface of the substrate.

* * * * *